(12) United States Patent
Kimura et al.

(10) Patent No.: US 10,804,950 B2
(45) Date of Patent: Oct. 13, 2020

(54) ACOUSTIC WAVE DEVICE, MULTIPLEXER, AND COMMUNICATION APPARATUS

(71) Applicant: KYOCERA Corporation, Kyoto-shi, Kyoto (JP)

(72) Inventors: Toshiya Kimura, Kyotanabe (JP); Masaki Nambu, Katano (JP); Masaru Nagata, Kyotanabe (JP); Toshiki Matsuoka, Kizugawa (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/494,752

(22) PCT Filed: Mar. 20, 2018

(86) PCT No.: PCT/JP2018/011050
§ 371 (c)(1),
(2) Date: Sep. 16, 2019

(87) PCT Pub. No.: WO2018/174064
PCT Pub. Date: Sep. 27, 2018

(65) Prior Publication Data
US 2020/0106469 A1   Apr. 2, 2020

(30) Foreign Application Priority Data

Mar. 22, 2017   (JP) ................. 2017-056256
Mar. 22, 2017   (JP) ................. 2017-056270

(51) Int. Cl.
*H04B 1/40*   (2015.01)
*H03H 9/02*   (2006.01)
(Continued)

(52) U.S. Cl.
CPC ........... *H04B 1/40* (2013.01); *H03H 9/02637* (2013.01); *H03H 9/02834* (2013.01);
(Continued)

(58) Field of Classification Search
CPC .. H04B 1/40; H03H 9/02637; H03H 9/02834; H03H 9/02897; H03H 9/02992;
(Continued)

(56) References Cited

U.S. PATENT DOCUMENTS 7,353,710 B2 * 4/2008 Oikawa ................ G01L 9/0025
                                                             73/703
7,427,824 B2   9/2008 Iwamoto et al.
(Continued)

FOREIGN PATENT DOCUMENTS

JP   2008-227748 A   9/2008
JP   4586852 B2   9/2010
(Continued)

*Primary Examiner* — Nguyen T Vo
(74) *Attorney, Agent, or Firm* — Procopio Cory Hargreaves and Savitch LLP

(57) ABSTRACT

A SAW device includes a piezoelectric substrate, a support substrate which is located on a lower surface of the piezoelectric substrate and has a smaller thermal expansion coefficient than that of the piezoelectric substrate, an IDT electrode located on the piezoelectric substrate, a cover forming a space above the IDT electrode, and a plurality of first strip conductors which extend alongside each other on the cover and at least a part of which overlaps the space when viewed on a plane.

16 Claims, 15 Drawing Sheets

(51) Int. Cl.
*H03H 9/72* (2006.01)
*H03H 9/10* (2006.01)
*H03H 9/145* (2006.01)
*H03H 9/25* (2006.01)
*H03H 9/64* (2006.01)
*H03H 9/05* (2006.01)

(52) U.S. Cl.
CPC .... *H03H 9/02897* (2013.01); *H03H 9/02992* (2013.01); *H03H 9/059* (2013.01); *H03H 9/1071* (2013.01); *H03H 9/145* (2013.01); *H03H 9/25* (2013.01); *H03H 9/6483* (2013.01); *H03H 9/725* (2013.01)

(58) Field of Classification Search
CPC ...... H03H 9/059; H03H 9/1071; H03H 9/145; H03H 9/25; H03H 9/6483; H03H 9/725
See application file for complete search history.

(56) References Cited

U.S. PATENT DOCUMENTS

| | | | |
|---|---|---|---|
| 2006/0043822 A1* | 3/2006 | Yokota | H03H 3/08 310/313 R |
| 2007/0252481 A1 | 11/2007 | Iwamoto et al. | |
| 2011/0221546 A1 | 9/2011 | Yamaji et al. | |
| 2014/0191617 A1* | 7/2014 | Ohashi | H03H 9/1092 310/348 |

FOREIGN PATENT DOCUMENTS

| | | |
|---|---|---|
| JP | 2011-188255 A | 9/2011 |
| JP | 2016-123020 A | 7/2016 |
| WO | 2016/129662 A1 | 8/2016 |

* cited by examiner

ACOUSTIC WAVE DEVICE, MULTIPLEXER, AND COMMUNICATION APPARATUS

TECHNICAL FIELD

The present disclosure relates to an electronic part utilizing an acoustic wave, that is, an acoustic wave device, and a multiplexer and a communication apparatus including the acoustic wave device. The acoustic wave is for example a surface acoustic wave (SAW).

BACKGROUND ART

As an acoustic wave device, there is known a so-called "WLP (wafer level package)" type one. A WLP type acoustic wave device for example has a piezoelectric substrate, an excitation electrode positioned on an upper surface of the piezoelectric substrate, and a cover which covers the upper surface of the piezoelectric substrate from the top of the excitation electrode and seals the excitation electrode. The cover is for example formed so as to form a space on the excitation electrode so that the acoustic wave easily propagates on the upper surface of the piezoelectric substrate (so that the piezoelectric substrate easily vibrates).

In the configuration as described above, in order to suppress warping of the cover to the space side, there is known the technique of providing a reinforcing layer made of a conductor (metal) on the upper surface side of the cover (for example Patent Literature 1 to 3). Patent Literature 1 discloses a reinforcing layer having a stripe-shaped or mesh-shaped planar shape.

CITATION LIST

Patent Literature

Patent Literature 1: Japanese Patent Publication No. 2008-227748
Patent Literature 2: Japanese Patent No. 4586852
Patent Literature 3: Japanese Patent Publication No. 2011-188255

SUMMARY OF INVENTION

An acoustic wave device according to one aspect of the present disclosure includes piezoelectric substrate, a support substrate which is located on a lower surface of the piezoelectric substrate and has a smaller thermal expansion coefficient than that of the piezoelectric substrate, an excitation electrode located on the piezoelectric substrate, a cover forming a space above the excitation electrode, and a plurality of first strip conductors which extend alongside each other on the cover and at least a part of which overlaps the space in a plane perspective.

A multiplexer according to one aspect of the present disclosure includes a transmission filter which filters a transmission signal and outputs the result to an antenna and a receiving filter which filters a reception signal from the antenna. At least a part of the transmission filter and receiving filter being included in the acoustic wave device described above.

A communication apparatus according to one aspect of the present disclosure includes an antenna, a multiplexer described above which is connected with the antenna, and an IC connected to the multiplexer.

BRIEF DESCRIPTION OF DRAWINGS

FIG. 4A is a cross-sectional view taken along the IVa-IVa line in FIG. 1, while

DESCRIPTION OF EMBODIMENTS

Figure 1:
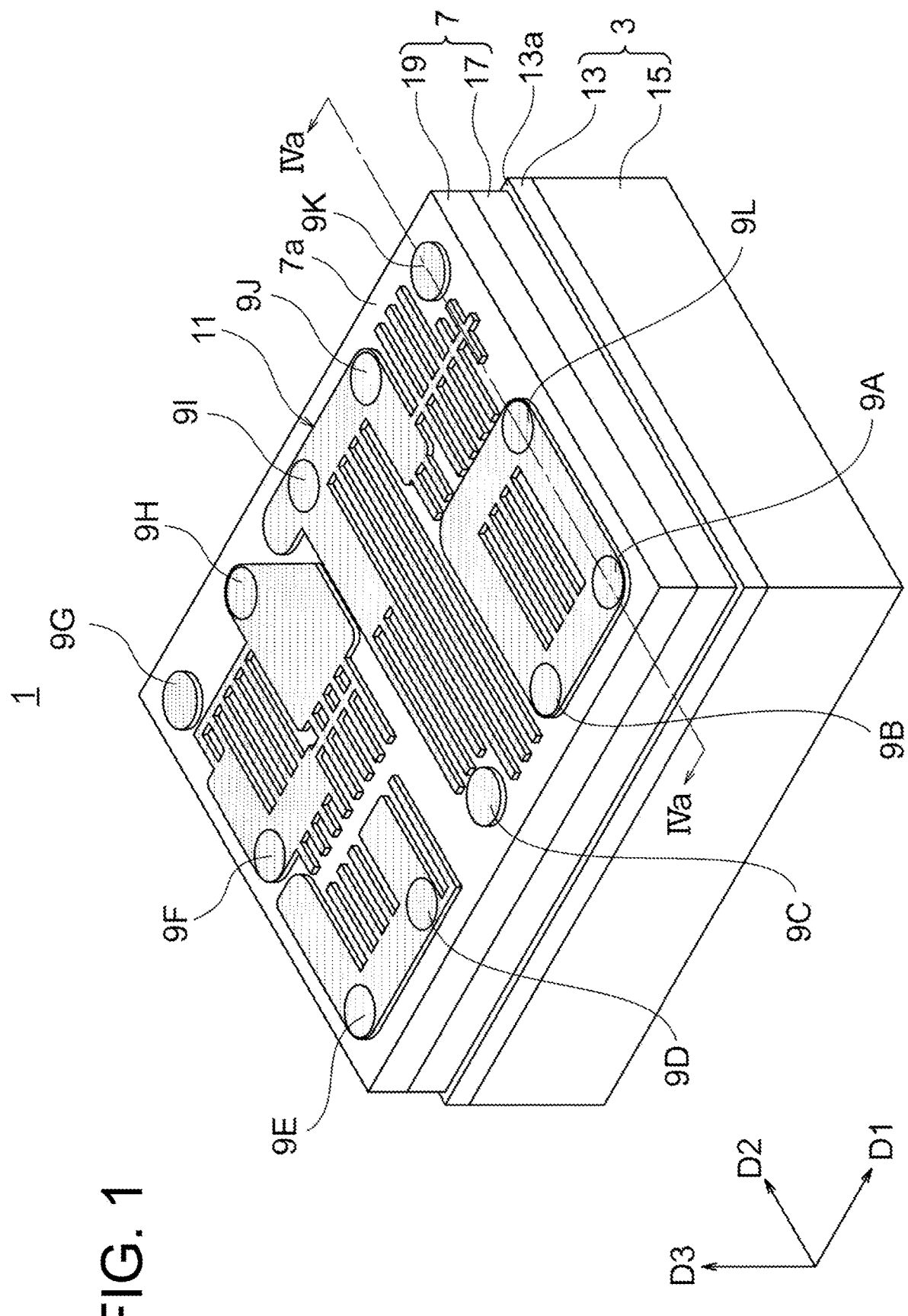
FIG. 1 is a perspective view of an outer appearance showing a SAW device according to a first embodiment.

Below, embodiments according to the present disclosure will be explained with reference to the drawings. Note that, the drawings used in the following explanation are schematic ones. Size ratios etc. in the drawings do not always coincide with the actual ones.

For the same or similar configurations, sometimes notations of mutually different alphabetic letters will be attached to notations of the same terms and the same numerals such as the "terminal 9A" and "terminal 9B". Further, in this case, sometimes the configurations will be simply referred to as the "terminals 9" and the alphabetic letters will be omitted.

In the second and following embodiments, for configurations which are common with or similar to already explained configurations, sometimes the notations attached to the already explained configurations will be used. Further, sometimes illustrations and explanations will be omitted. Note that, for configurations which correspond (are similar) to already explained configurations, even in a case where different notations from those of the already explained configurations are attached, the points which are not particularly explained are the same as the already explained configurations.

In the SAW device according to the present disclosure, any direction may be defined as the "above" or "below". In the following explanation, however, for convenience, an orthogonal coordinate system comprised of a D1 axis, D2 axis, and D3 axis will be defined, and sometimes the "upper surface", "lower surface", and other terms will be used where the positive side of the D3 axis is the upper part. Further, when referring to "viewed on a plane" or "plane perspective", unless particularly explained, this means "viewed in the D3 axis direction". Note that, the D1 axis is defined as parallel to the direction of propagation of the SAW propagating along the upper surface of the piezoelectric substrate which will be explained later, the D2 axis is defined as parallel to the upper surface of the piezoelectric substrate and perpendicular to the D1 axis, and the D3 axis is defined as perpendicular to the upper surface of the piezoelectric substrate.

First Embodiment (Overall Configuration of SAW Device)

Figure 2:
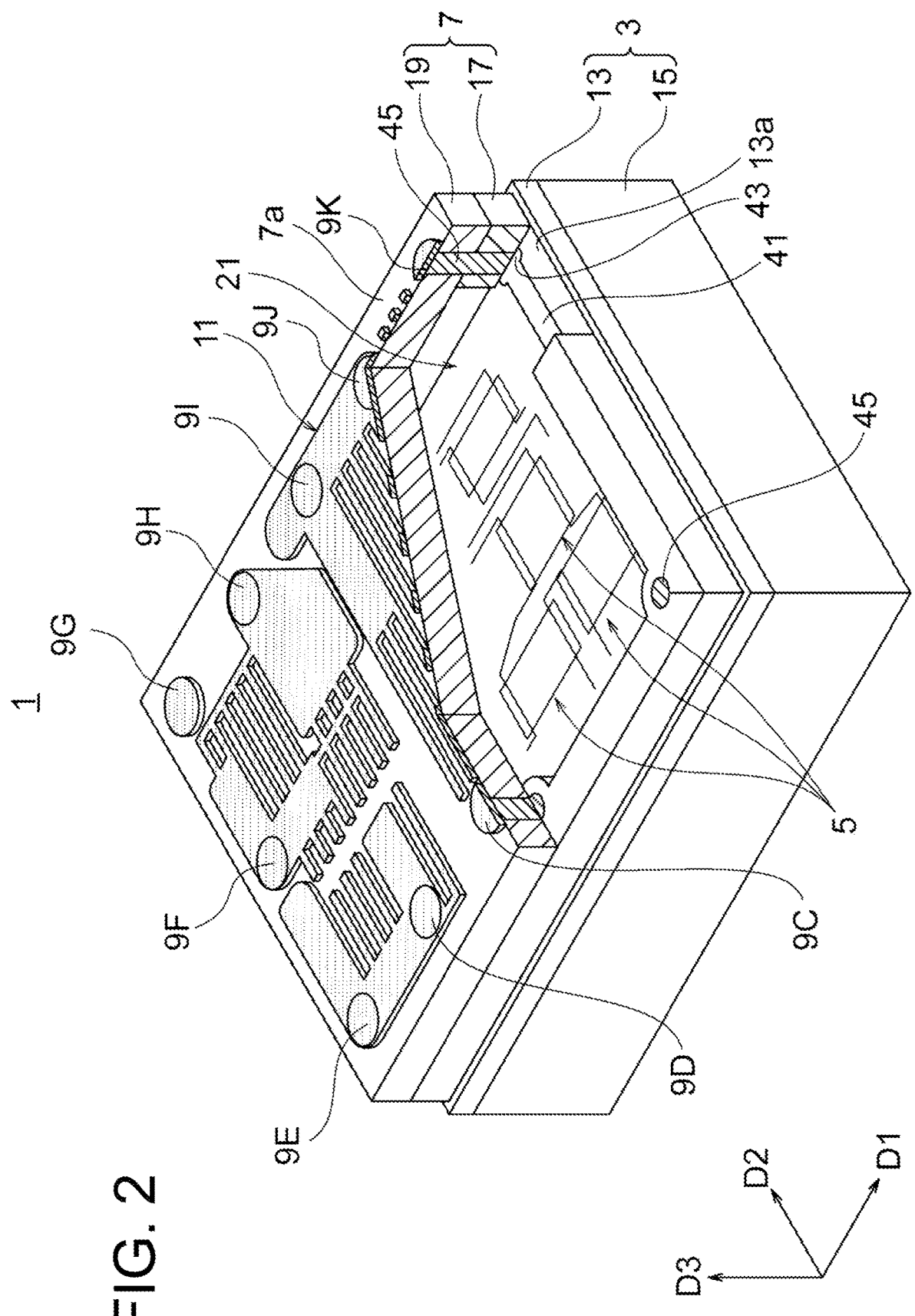
FIG. 2 is a perspective view showing the SAW device in FIG. 1 with a part cut away.

FIG. 1 is a perspective view of an outer appearance showing the configuration of a SAW device 1 according to a first embodiment. FIG. 2 is a perspective view showing the SAW device 1 with a part cut away.

The SAW device 1 is a WLP type electronic part. Its outer shape is for example made schematically a thin rectangular cuboid shaped. Dimensions of the SAW device 1 may be suitably set. If mentioning one example, the length of one side (D1 axis direction or D2 axis direction) when viewed on a plane is 0.3 mm to 2 mm, and the thickness (D3 axis direction) is 0.2 mm to 0.6 mm.

At the upper surface of the SAW device 1, a plurality of (12 in the example shown) terminals 9A to 9K are exposed. The SAW device 1 is for example arranged so that its upper surface faces a not shown circuit board and is mounted on the circuit board by bonding of pads on the circuit board and the terminals 9 by solder or other bumps. After that, a not shown mold resin is applied to the periphery of the SAW device 1 by a transfer mold or the like so that the SAW device 1 is sealed by the resin. The mold resin is also filled in a clearance formed between the circuit board and the SAW device 1 by the thicknesses of the bumps.

The SAW device 1 for example has a substrate 3, one or more (in the example shown, a plurality of) SAW resonators 5 (FIG. 2) provided on the upper surface of the substrate 3, a cover 7 covering the SAW resonators 5, the plurality of terminals 9 explained above which are exposed at an upper surface 7a of the cover 7, and a reinforcing layer 11 superposed on the upper surface 7a of the cover 7.

The substrate 3 for example has a piezoelectric substrate 13 and a support substrate 15 bonded to the lower surface of the piezoelectric substrate 13.

The piezoelectric substrate 13 is for example configured by a single crystal having a piezoelectric characteristic. The single crystal is for example comprised of lithium tantalate ($LiTaO_3$), lithium niobate ($LiNbO_3$), or quartz crystal ($SiO_2$). The cut angle may be suitably set. For example, the piezoelectric substrate 13 is a rotated Y-cut and X-propagating one. That is, the X-axis is parallel to the upper surface (D1 axis) of the piezoelectric substrate 13, and the Y-axis is inclined at a predetermined angle relative to the normal line of the upper surface of the piezoelectric substrate 13.

The planar shape of the piezoelectric substrate 13 is for example rectangular. The size of the piezoelectric substrate 13 may be suitably set. If giving one example, the length of one side (D1 axis direction or D2 axis direction) when viewed on a plane is 0.3 mm to 2 mm, and the thickness (D3 axis direction) is 0.1 μm to 30 μm. The thickness may be defined according to the wavelength of the SAW excited by the SAW resonators 5 as well. In that case, it may be set to 0.05λ to 15λ as well. For example, when the SAW device 1 functions as a 2 GHz filter, 1λ becomes about 2 μm.

The support substrate 15 is for example formed by a material having a smaller thermal expansion coefficient than that of the material for the piezoelectric substrate 13. Due to this, for example, it will not aid the thermal expansion of the piezoelectric substrate 13, therefore the change of electrical characteristics of the SAW device 1 due to temperature can be reduced. In particular, when the piezoelectric substrate 13 and the support substrate 15 are directly bonded or are bonded through an interposed layer not more than 15λ, thermal deformation of the piezoelectric substrate 13 is suppressed by the support substrate 15, therefore the change of the electrical characteristics of the SAW device 1 due to temperature can be reduced. As such amaterial, for example, there can be mentioned silicon or another semiconductor, sapphire or another single crystal, and an aluminum oxide sintered body or another ceramic. Note that, the support substrate 15 may be configured by stacking a plurality of layers which are made of different materials from each other as well.

The planar shape of the support substrate 15 and its dimensions when viewed on a plane are for example equal to those of the piezoelectric substrate 13. The thickness of the support substrate 15 may be suitably set. For example, the thickness of the support substrate 15 is made greater than the thickness of the piezoelectric substrate 13. As one example, the thickness of the support substrate 15 is 10 times or more of the thickness of the piezoelectric substrate 13. Further, for example it is 100 μm to 300 μm.

The piezoelectric substrate 13 and the support substrate 15 are for example bonded to each other through a not shown interposed layer. The material of the interposed layer may be an organic material or inorganic material. As an organic material, for example, there can be mentioned a thermosetting resin or another resin. As an inorganic material, for example, there can be mentioned $SiO_2$, $Si_3N_4$, AlN, etc. Further, a laminate formed by laminating thin layers made of a plurality of different materials may be used as the interposed layer as well. As such a laminate, for example, an acoustic reflection film may be configured as well. Further, the piezoelectric substrate 13 and the support substrate 15 may be bonded to each other by so-called direct bonding activating the bonding surfaces by plasma, neutron rays, or the like, then bonding the two to each other without an interposed layer.

The SAW device 5 is configured by provision of a conductive layer etc. on the upper surface 13a of the piezoelectric substrate 13. The plurality of SAW resonators 5 for example may be connected in a ladder-shape to configure a ladder type SAW resonator filter. Further, by providing two or more such filters, a plurality of SAW resonators 5 (SAW device 1) may configure a multiplexer (for example duplexer) as well.

Note that, in the explanation of the present embodiment, when explaining the functions etc. of the terminals 9, sometimes a case where the SAW device 1 is a multiplexer will be used as an example.

The cover 7 for example has a frame 17 which is frame-shaped when viewed on a plane and a lid 19 closing the opening of the frame 17. Due to this, above the upper surface 13a of the piezoelectric substrate 13, a space 21 (FIG. 2) for facilitating vibration of the upper surface 13a is configured.

The frame 17 is for example configured by formation of one or more openings forming the space 21 in a layer having substantially a constant thickness. The thickness of the frame 17 (thickness of the space 21) is for example a few μm to 30 μm. The lid 19 is for example configured by a layer having substantially a constant thickness which is stacked over the frame 17. The thickness of the lid 19 is for example a few µm to 30 µm.

The frame 17 and the lid 19 may be formed by the same material or may be formed by materials different from each other. In FIG. 1 and FIG. 2, for convenience of explanation, a borderline between the frame 17 and the lid 19 is clearly shown. In an actual product, however, the frame 17 and the lid 19 may be integrally formed by the same material as well.

The cover 7 (frame 17 and lid 19) is basically configured by an insulation material. The insulation material is for example a photosensitive resin. The photosensitive resin is for example a urethane acrylate-based, polyester acrylate-based, or epoxy acrylate-based resin which is cured by radical polymerization of an acryl group or methacryl group. Note that, a conductor may be arranged in a part of the cover 7 as well. Note that, the thermal expansion coefficient of the cover 7 may be a suitable magnitude. For example, it is larger than the thermal expansion coefficient of the material for the piezoelectric substance configuring the piezoelectric substrate 13.

The terminals 9 are for example configured by layered conductors (for example metal) positioned on the upper surface 7a of the cover 7. The metal is for example Cu. Note that, the terminals 9 may be configured by a plurality of conductor layers (plurality of materials) as well. The planar shapes of the terminals 9 may be suitably set. In the example shown, they are circular. The terminals 9 are for example electrically connected with the SAW resonators 5 as will be explained later. The number and arrangement of the plurality of terminals 9 may be suitably set. In the example shown, the plurality of terminals 9 are arranged along an outer circumferential edge of the rectangular cover 7 (piezoelectric substrate 13) when viewed on a plane.

The roles of the terminals 9A to 9L may be suitably set. For example, the terminals 9C, 9G, and 9K are terminals utilized for input or output of signals, and the other terminals 9 (9A, 9B, 9D, 9F, 9H, 9I, 9J, and 9L) are terminals given the reference potential. When the SAW device 1 is a multiplexer, for example, the terminal 9C is an antenna terminal connected with the antenna, one of the terminals 9G and 9K is a transmission terminal receiving as input a transmission signal to be output from the antenna terminal (9C), and the other is a reception terminal outputting a reception signal input from the antenna terminal.

The material for the reinforcing layer 11 is for example a material having a higher Young's modulus than that of the material for the cover 7. For example it is a metal (conductor). The metal is for example Cu. Further, it may also be the same as the material for the terminals 9 (most part thereof). Further, the reinforcing layer 11 may be configured by a plurality of conductor layers (plurality of materials) as well. The conductor (material for the reinforcing layer 11, metal) is generally larger in thermal expansion coefficient than the material for the piezoelectric member configuring the piezoelectric substrate 13. Note that, one of the material for the reinforcing layer 11 and the material for the cover 7 may be larger in thermal expansion coefficient than the other. The thickness of the reinforcing layer 11 may be suitably set. For example, it is 20 µm to 30 µm.

(Fundamental Configuration of SAW Resonator)

Figure 3:
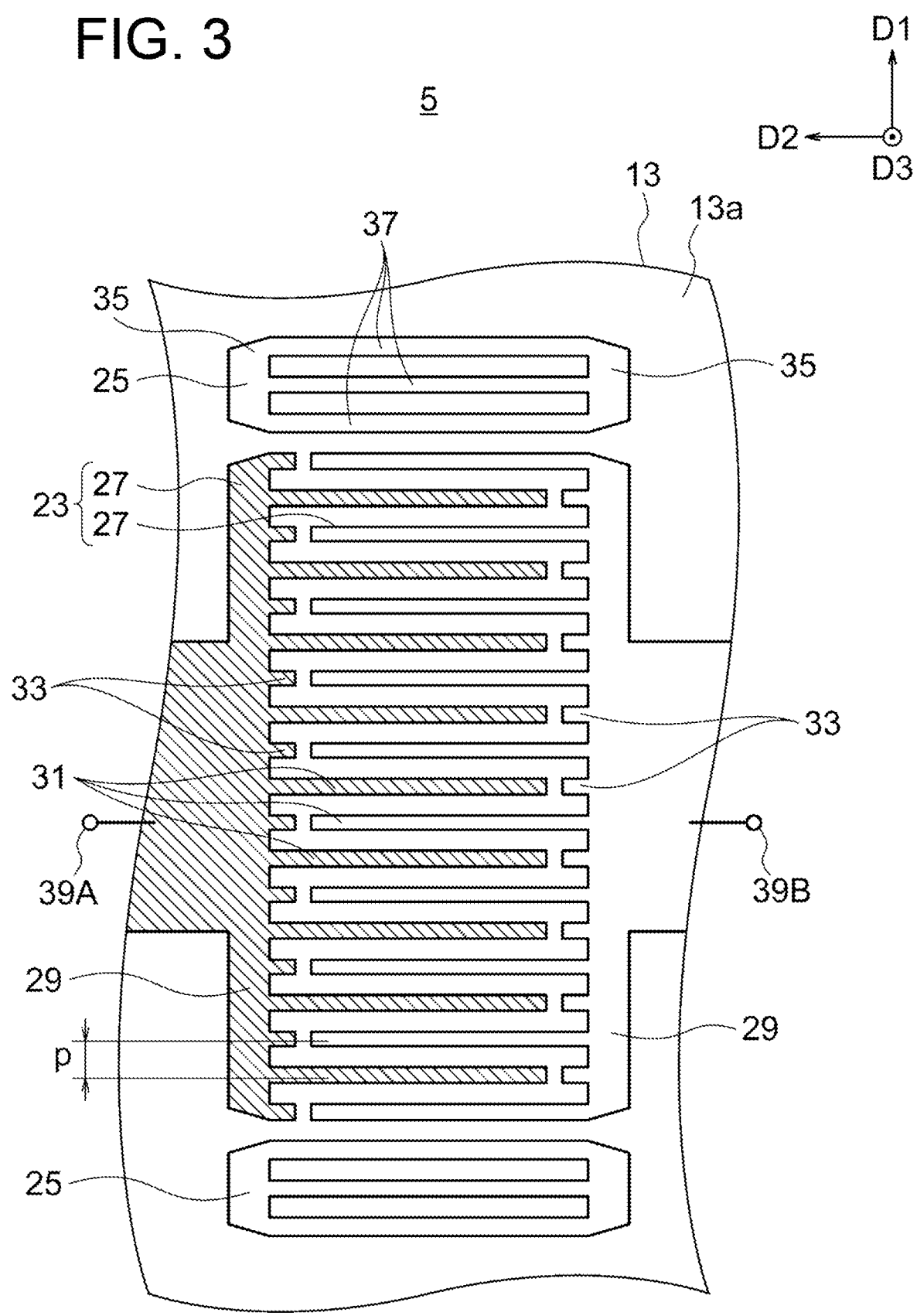
FIG. 3 is a plan view showing the configuration of a SAW resonator provided in the SAW device in FIG. 1.

FIG. 3 is a plan view showing the configuration of a SAW resonator 5.

The SAW resonator 5 is configured by a so-called 1-port SAW resonator. The SAW resonator 5 for example generates resonation when receiving as input an electrical signal having a predetermined frequency from one of the conceptually and schematically shown pads 39A and 39B and outputs the signal where resonation occurs from the other of the pads 39A and 39B.

The SAW resonator 5 for example includes a piezoelectric substrate 13 explained above, an IDT (interdigital transducer) electrode 23 provided on the upper surface 13a of the piezoelectric substrate 13, and a pair of reflectors 25 which are positioned on the two sides of the IDT electrode 23.

The IDT electrode 23 and the reflectors 25 are configured by layer-shaped conductors provided on the piezoelectric substrate 13. The IDT electrode 23 and reflectors 25 are for example configured by mutually the same materials to mutually same thicknesses. The layer-shaped conductors configuring them are for example metal. The metal is Al or an alloy containing Al as a principal ingredient (Al alloy). The Al alloy is for example an Al—Cu alloy. The layer-shaped conductors may be configured by a plurality of metal layers as well. The thickness of the layer-shaped conductor is suitably set in accordance with the electrical characteristics etc. demanded from the SAW resonator 5. As one example, the thickness of the layer-shaped conductor is 50 nm to 600 nm.

The IDT electrode 23 includes a pair of comb-shaped electrodes 27. Note that, in order to improve visibility, hatching is attached to one comb-shaped electrode 27. The comb-shaped electrodes 27 have bus bars 29, pluralities of electrode fingers 31 extending from the bus bars 29 alongside each other, and dummy electrodes each of which projecting from the bus bar 29 between the two or more electrode fingers 31. The pair of comb-shaped electrodes 27 are arranged so that the pluralities of electrode fingers 31 intermesh (intersect) with each other.

The bus bars 29 are for example substantially formed in long shapes so as to linearly extend in the direction of propagation of the SAW (D1 axis direction) with constant widths. Further, the pair of bus bars 29 face each other in a direction (D2 axis direction) perpendicular to the direction of propagation of the SAW. Note that, the bus bars 29 may be changed in widths or be inclined relative to the direction of propagation of the SAW.

The electrode fingers 31 are for example substantially formed in long shapes so as to linearly extend in the direction (D2 axis direction) perpendicular to the direction of propagation of the SAW with constant widths. In each comb-shaped electrode 27, the plurality of electrode fingers 31 are arranged in the direction of propagation of the SAW. Further, the plurality of electrode fingers 31 in one comb-shaped electrode 27 and the plurality of electrode fingers 31 in the other comb-shaped electrode 27 are basically alternately arranged.

A pitch "p" of the plurality of electrode fingers 31 (for example a distance between the centers of two mutually neighboring electrode fingers 31) is basically constant in the IDT electrode 23. Note that, in a part of the IDT electrode 23, a narrow pitch part in which the pitch "p" becomes narrower than that in the other majority part and a broad pitch part in which the pitch "p" becomes broader than that in the other majority part may be provided as well.

The number of the electrode fingers 31 may be suitably set in accordance with the electrical characteristics etc. demanded from the SAW resonator 5. Note that, FIG. 2 is a schematic view, therefore a smaller number of electrode fingers 31 are shown. In actuality, a larger number of electrode fingers 31 than those shown may be arranged. The same is true for the strip electrodes 37 in the reflector 25 which will be explained later.

The lengths of the pluralities of electrode fingers 31 are for example equal to each other. Note that, the IDT electrode 23 may be so-called apodized so as to change in the lengths of the pluralities of electrode fingers 31 (from another viewpoint, intersecting widths) in accordance with the positions in the direction of propagation. The lengths and widths of the electrode fingers 31 may be suitably set in accordance with the demanded electrical characteristics etc.

The dummy electrodes 33 for example project to a direction perpendicular to the direction of propagation of the SAW with substantially constant widths. The widths thereof are for example equal to the widths of the electrode fingers 31. Further, the plurality of dummy electrodes 33 are arranged at an equal pitch to that of the plurality of electrode fingers 31. The front end of a dummy electrode 33 in one comb-shaped electrode 27 faces the front end of an electrode finger 31 in the other comb-shaped electrode 27 across a gap. Note that, the IDT electrode 23 may be one not including dummy electrodes 33 as well.

The pair of reflectors 25 are positioned on the two sides of the IDT electrode 23 in the direction of propagation of the SAW. Each reflector 25 is for example made an electrically floating state or may be given the reference potential. Each reflector 25 is for example formed in a lattice shape. That is, the reflector 25 includes a mutually facing pair of bus bars 35 and pluralities of strip electrodes 37 extending between the pair of bus bars 35. The pitch of the plurality of strip electrodes 37 and the pitch of the mutually neighboring electrode finger 31 and strip electrode 37 are basically equal to the pitch of the plurality of electrode fingers 31.

Note that, although not particularly shown, the upper surface 13a of the piezoelectric substrate 13 may be covered by a protective film made of $SiO_2$, $Si_3N_4$, or the like from the tops of the IDT electrodes 23 and reflectors 25 as well. The protective film may be a laminate of a plurality of layers configured by these materials as well. The protective film may be one for simply suppressing corrosion of the IDT electrodes 23 etc. or may be one contributing to temperature compensation. Further, when the protective film is provided or the like, on the upper surfaces or lower surfaces of the electrodes 23 and reflectors 25, additional films made of an insulator or metal may be provided in order to improve the reflection coefficient of the SAW.

When the protective film is provided, the protective film may be interposed or may not be interposed between the piezoelectric substrate 13 and the frame 17. That is, the cover 7 may be directly placed or indirectly placed on the upper surface 13a of the piezoelectric substrate 13.

By application of voltage to the upper surface 13a of the piezoelectric substrate 13 by one comb-shaped electrode 27, a SAW propagating through the upper surface 13a in the D1 axis direction is excited. In the SAW resonator 5, the resonance frequency becomes substantially equal to the frequency of the SAW having the pitch "p" of the electrode fingers 31 as a half wavelength. The antiresonance frequency is determined by the resonance frequency and capacity ratio, while the capacity ratio is mainly set by the piezoelectric substrate 13 and is adjusted by the number of the electrode fingers 13, their intersecting widths, their thicknesses, etc.

(Connection of Terminals and SAW Resonators)

Figure 4A:
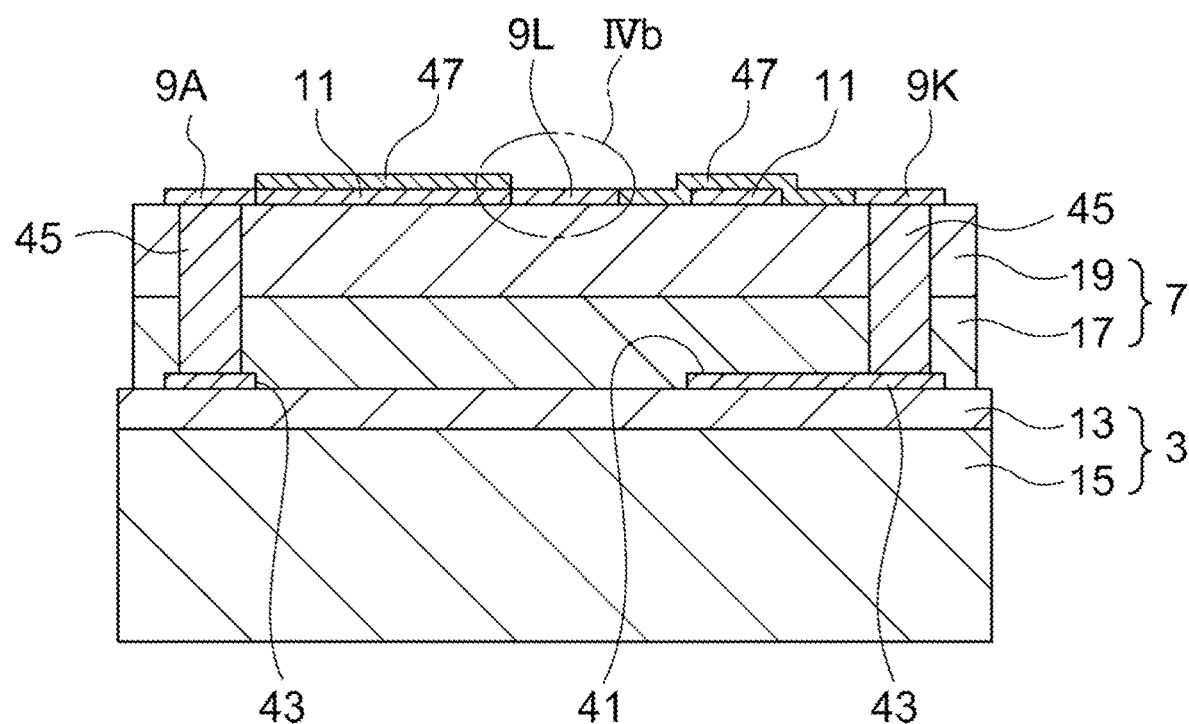
Figure 4B:
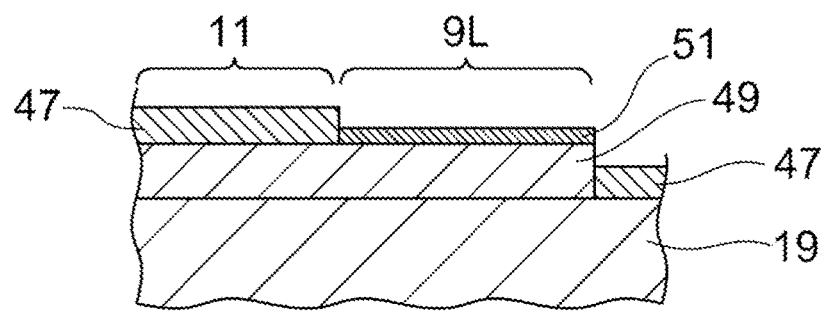
FIG. 4B is an enlarged view of a region IVb in FIG. 4A.

FIG. 4A is a cross-sectional view taken along the IVa-IVa line in FIG. 1. FIG. 4B is an enlarged view of a region IVb in FIG. 4A.

As described above, the terminals 9 are electrically connected with a SAW resonator 5 (IDT electrode 23). More specifically, for example, as shown in FIG. 2 and FIG. 4A, a part (for example 9A and 9K) of the plurality of terminals 9 is connected with the SAW resonator 5 by the wiring 41, pads 43, and via conductors 45.

The wiring 41 and pads 43 are for example configured by provision of conductor layers on the upper surface 13a of the piezoelectric substrate 13. The conductors may be configured by conductor layers which are the same in material and thickness as the conductor layers configuring the IDT electrode 23 and reflectors 25. Note that, the pads 43 may include a conductor layer which is configured by another material on the conductor layer common to the other parts as well. The wiring 41 for example connects the SAW resonator 5 and the pads 43 or connect SAW resonators 5 to each other. Note that, a wiring 41 which intersects a wiring 41 configured by the same conductor layer as the conductor layer configuring the IDT electrode 23 through an insulation layer may be provided as well.

The via conductors 45 are for example formed in columnar shapes standing on the pads 43 and penetrate through the frame 17 and lid 19. The via conductors 45 are for example configured by Cu or another metal. Note that, the via conductors 45 may be configured by a plurality of materials as well. For example, the internal parts and the outer circumferential surfaces may be configured by mutually different materials as well. On the via conductors 45, part (for example 9A and 9K) of the plurality of terminals 9 are arranged. Note that, the via conductors 45 may be integrally formed from the same materials as those for the plurality of terminals 9 and reinforcing layer 11 as well.

Further, as shown in FIG. 4A, the other parts (for example 9L) of the plurality of terminals 9 are not provided on the via conductors 45, but are connected through the reinforcing layer 11 with the via conductors 45.

Note that, such terminals 9 which are not positioned on via conductors 45 may be suitably differentiated from the reinforcing layer 11. For example, when the SAW device 1 is surface-mounted on a not shown circuit board by not shown bumps, they can be identified by the joined positions of those bumps. Further, for example, the positions of the terminals 9 may be identified based on a pamphlet and specifications of the SAW device 1 and the like. In turn, the terminals 9 and the reinforcing layer 11 may be differentiated.

Further, as shown in FIG. 4A and FIG. 4B, when an insulation layer 47 made of solder resist or the like is provided on the reinforcing layer 11, the parts exposed from the insulation layer 47 may be identified as the terminals 9. The insulation layer 47 for example contributes to reduction of the probability of unwanted short-circuiting caused due to the bumps. Note that, the insulation layer 47 need not be provided.

Further, as shown in FIG. 4B, when a first metal layer 49 configuring the terminals 9 and the reinforcing layer 11 and a second metal layer 51 configuring the surfaces of the terminals 9 (not configuring the surface of the reinforcing layer 11) are provided on the cover 7, the regions where the second metal layer 51 is arranged may be identified as the terminals 9. The first metal layer 49 is for example configured by Cu, and the second metal layer 51 is for example configured by Au or Ag. The second metal layer 51 for example contributes to improvement of the bonding strength of the terminals 9 and the bumps and/or prevention of corrosion of the terminals 9. Note that, the second metal layer 51 need not be provided.

(Planar Shape of Reinforcing Layer)

Figure 5:
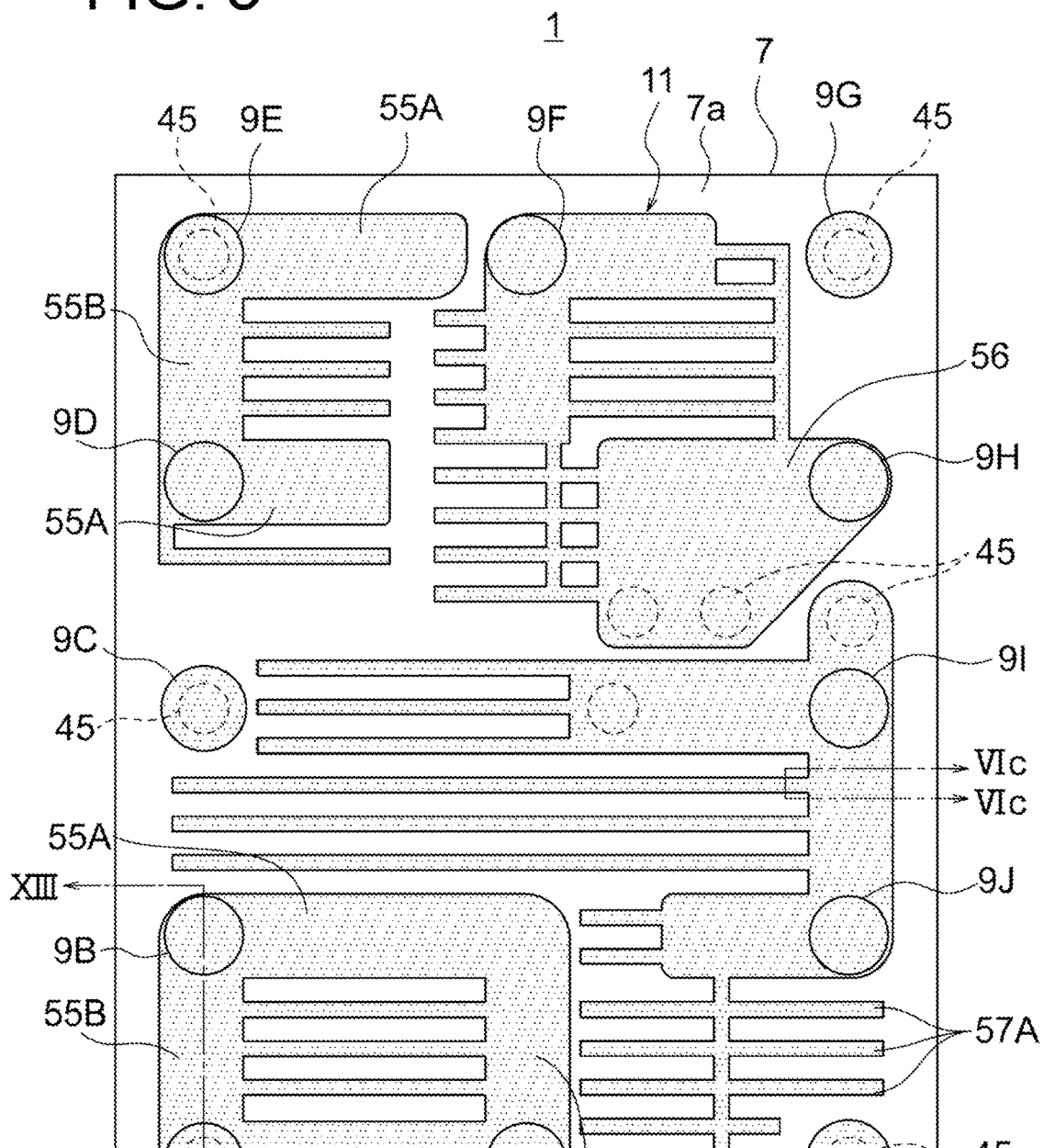
FIG. 5 is a plan view of the SAW device in FIG. 1.
Figure 5:
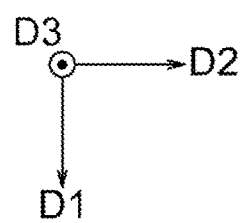

FIG. 5 is a plan view of the SAW device 1. Note that, in this view, the via conductors 45 are indicated by broken lines. In the example shown, among the terminals 9A to 9L, the terminals 9A, 9C, 9E, 9G, and 9K are positioned on the via conductors 45, and the other terminals 9 are separated from the via conductors 45.

The reinforcing layer 11, when viewed on a plane, includes a plurality of long-shaped patterns extending in predetermined directions. The plurality of long-shaped patterns for example include bus conductors 55A and 55B and strip conductors 57A and 57B having narrower widths than the bus conductors 55A. Note that, the reinforcing layer 11 may also include a conductor pattern which is difficult to classify as a long-shaped pattern (thought of as extending in a predetermined direction) such as an area pattern 56 which is connected to the terminal 9H.

The bus conductors 55A and strip conductors 57A additionally denoted by "A" are for example conductors which extend in the direction which is perpendicular to the direction (D1 axis direction) of propagation of the SAW (in the direction parallel to the electrode fingers 31). The bus conductors 55B and strip conductors 57B additionally denoted by "B" are for example conductors which extend in the direction of propagation of the SAW (D1 axis direction, direction perpendicular to the electrode fingers 31). Note that, in the other embodiments which will be explained later as well, the relative correspondence between the notations A and B of the bus conductors 55 and strip conductors 57 and the direction of propagation of the SAW are the same as those described above.

The reinforcing layer 11 is configured by the bus conductors 55 and strip conductors 57. Therefore, on the upper surface 7a of the cover 7, a plurality of regions where the reinforcing layer 11 and terminals 9 are not arranged are configured. The total area of the reinforcing layer 11 and terminals 9 may be suitably set. For example, the total area of the reinforcing layer 11 and terminals 9 is ⅔ or less or ½ or less of the area of the upper surface 7a.

As will be explained in detail later, the bus conductors 55 are connected to the via conductors 45 directly or indirectly through the terminals 9 or the like and in turn are connected through the pads 43 and wiring 41 with the IDT electrode 23. In the same way, the strip conductors 57 are connected to the via conductors 45 directly or indirectly through the bus conductors 55 or the like and in turn are connected through the pads 43 and wiring 41 with the IDT electrode 23. In other words, the bus conductors 55 or strip conductors 57 are connected with the IDT electrode 23 by connection conductors (via conductors 45, pads 43, wiring 41, etc.) with at least parts positioned in the cover 7. Due to this, heat dissipation routes from the IDT electrode 23 up to the bus conductors 55 or strip conductors 57 are configured (Bus Conductors)

The bus conductors 55 for example linearly extend with constant widths. The widths of the bus conductors 55 may be suitably set. For example, the widths of the bus conductors 55 are substantially equal to the widths of the terminals 9 (sizes of the terminals 9 in the width direction of the bus conductors 55 connected with the terminals 9, diameters where the terminals 9 are circular). The term "substantially equal" referred to here means for example a state where a difference of the two is ±20% or less of the widths of the terminals 9. Naturally, the widths of the bus conductors 55 may be smaller or larger than the widths of the terminals 9.

The number of the plurality of bus conductors 55 or the sum of areas may be suitably set. For example, the sum of areas of the bus conductors 55 (both of 55A and 55B) is less than ½ or less than ⅓ of the area of the upper surface of the cover 7. Further, the number of either of the bus conductors 55A or 55B may be larger as well. In the same way, either of the sum of areas of the bus conductors 55A or the sum of areas of the bus conductors 55B may be larger as well. In the example shown, the numbers of the bus conductors 55A and 55B (or sums of areas) are substantially equal. The number of the bus conductors 55A is just somewhat larger than that of the bus conductors 55B (or the sum of areas is larger).

The plurality of bus conductors 55 may be arranged at suitable positions on the upper surface 7a of the cover 7 with suitable lengths. For example, in FIG. 5, bus conductors 55 which extend adjacent to and along the outer edges (single sides) of the upper surface 7a with lengths shorter than the outer edges are provided. Further, bus conductors 55 which extend from positions adjacent to the outer edges of the upper surface 7a toward the inner side of the upper surface 7a are provided. Other than these, although not particularly shown, bus conductors 55 which extend adjacent to and along the outer edges (single sides) of the upper surface 7a with substantially equal lengths to those of the outer edges, bus conductors 55 which extend at positions away from the outer edges of the upper surface 7a, or bus conductors 55 which horizontally cut across or vertically cut across the upper surface 7a (that is, extend from one outer edge to another outer edge) may be provided as well. Note that, in the above description, "the bus conductors 55 are adjacent to the outer edges of the upper surface 7a" means for example a state where the distance between the bus conductors 55 and the outer edges is smaller than the widths of the bus conductors 55.

Also, the positions of the plurality of bus conductors 55 relative to the space 21 (from another viewpoint, frame 17) may be any positions. For example, among the plurality of bus conductors 55, the bus conductors 55 which extend along the outer edges of the upper surface 7a explained above overlap the frame 17 at least at the outer edge sides and are supported through the lid 19 upon the frame 17. Further, for example, the bus conductors 55 which extend from the outer edges of the upper surface 7a to the inner side are supported at the outer edge sides through the lid 19 upon the frame 17 and overlap the space 21 at its inner side. Note that, where a plurality of spaces 21 are configured, the bus conductors 55 may be positioned on wall parts (frames 17) partitioning the plurality of spaces 21 as well. Further, unlike the example shown, in a plane perspective, there may also be no bus conductors 55 overlapping the space 21.

The plurality of bus conductors 55 may be arranged with mutually suitable positional relationships. Further, they may be suitably connected through or not through the terminals 9 to configure predetermined shapes as well. For example, two bus conductors 55 may be connected so as to configure an L-shape (see the vicinity of the terminal 9F), three bus conductors 55 may be connected so as to form three sides of a rectangle (see the vicinities of the terminals 9D and 9E), or four bus conductors 55 may be connected so as to form four sides of a rectangle (see the vicinities of the terminals 9A, 9B, and 9L). Other than these, two (may be grasped as three too) bus conductors 55 may be connected so as to configure a T-shape or two (may be grasped as four too) bus conductors 55 may be connected so as to configure a cross.

The bus conductors 55 for example extend from the terminals 9. The terminals 9 connected with the bus conductors 55 may be ones positioned on the via conductors 45 (9A etc.) or may be ones separated from the via conductors 45 (9L etc.). The terminals 9 connected with the bus conductors 55 are for example terminals given the reference potential. Note that, unlike the example shown, the bus conductors 55 may be separated from the terminals 9 or may extend from the terminals 9 to/from which signals are input/output in place of the terminals 9 given the reference potential.

In the following explanation, for example, it is not considered that the terminal 9I is positioned at the middle of one bus conductor 55B. It is considered that two bus conductors 55B extend from the terminal 9I to mutually reverse sides. The number of bus conductors 55 will be counted considering the situation in this way. At this time, the number of the bus conductors 55 extending from one terminal 9 may be any of 1 to 4. The bus conductors 55 may contribute to or may not contribute to electrical connection of the two terminals 9.

The shapes (L-shape etc.) formed by pluralities of bus conductors 55 and the mode of connection between the bus conductors 55 and the terminals 9 may be suitably combined.

For example, in FIG. 5, the terminal 9L which is separated from the via conductor 45 is positioned at the corner of the L-shape configured by two bus conductors 55. In other words, from the terminal 9L, (at least) two bus conductors 55 (55A and 55B) extend in directions intersecting (for example perpendicular) with respect to each other. The same is true for the terminals 9B, 9D, 9F, 9I, and 9J (these are the terminals 9 separated from the via conductors 45).

Further, for example, the terminal 9L which is separated from the via conductor 45 is positioned at one corner of the three sides in a rectangle configured by the three bus conductors 55. In other words, bus conductors 55A and 55B extending from the terminal 9L are provided, while a bus conductor 55B which extends from a position on the side separated from the terminal 9L in the bus conductor 55A extending from the terminal 9L so as to be alongside the bus conductor 55B extending from the terminal 9L is provided (A and B may be vice versa as well). The same is true for the terminals 9B, 9D, 9I, and 9J (they are terminals 9 separated from the via conductors 45).

Further, for example, the terminal 9L separated from the via conductor 45 is positioned at one corner of the four sides in a rectangle configured by four bus conductors 55. In other words, bus conductors 55A and 55B extending from the terminal 9L are provided, while bus conductors 55B and 55A which extend from the former bus conductors 55A and 55B extending from the terminal 9L at positions on the sides separated from the terminal 9L are provided alongside the former bus conductors 55B and 55A extending from the terminal 9L. The same is true for the terminal 9B (terminal 9 separated from the via conductor 45).

Note that, the terminals 9 which are separated from the via conductors 45 were focused on. However, the positional relationships between shapes formed by the bus conductors 55 and the terminals 9 which are the same as those described above may also stand for the via conductors 45 on the terminals 9.

(Strip Conductors)

The strip conductors 57 for example linearly extend with constant widths. The widths of the strip conductors 57 may be suitably set. For example, the widths of the strip conductors 57 are ½ or less or ¼ or less of the widths of the bus conductors 55 (from another viewpoint, the widths or maximum diameters of the terminals 9).

The number and total area of the plurality of strip conductors 57 may be suitably set. For example, the number of the plurality of strip conductors 57 (total of 57A and 57B) is larger than the number of the plurality of bus conductors 55 (total of 55A and 55B). Further, for example, the total area of the plurality of strip conductors 57 may be larger than, equal to, or smaller than the total area of the plurality of bus conductors 55.

The number of either of the strip conductors 57A or 57B may be larger as well. In the same way, either of the total area of the strip conductors 57A or the total area of the strip conductors 57B may be larger as well. In the present embodiment, the number of the strip conductors 57A extending in the direction (D2 axis direction) perpendicular to the direction of propagation of the SAW is larger (or the total area is larger) than the number of the strip conductors 57B extending in the direction of propagation of the SAW. For example, the number of the strip conductors 57A (or total area) is larger than 2 times of the number (or total area) of the strip conductors 57B, 5 times or more, or 10 times or more.

The plurality of strip conductors 57 may be arranged at suitable positions on the upper surface 7a of the cover 7 with suitable lengths. For example, the strip conductors 57 may have lengths that substantially horizontally cut across or vertically cuts across the upper surface 7a or may not have such lengths. Also, the positions of the plurality of strip conductors 57 relative to the space 21 (from another viewpoint, the frame 17) may be suitably set. However, for example, at least part of the strip conductors 57 overlap the space 21 in parts or entireties of the length directions thereof.

The plurality of strip conductors 57 may be arranged in mutually suitable positional relationships. Further, they may be suitably connected to configure predetermined shapes. In the example shown, a relatively large number of strip conductors 57A are arranged in the direction of propagation of the SAW at substantially equal pitches. Further, the strip conductors 57B intersect with the plurality of strip conductors 57A. Note that, in the explanation of the present embodiment, when describing "the strip conductors 57A and the strip conductors 57B intersect", it includes not only such intersections that configure crosses, but also intersections that configure T-shapes or L-shapes.

Even at the time when not the entireties of the strip conductors 57 on the upper surface 7a of the cover 7, but one set of strip conductors 57A and 57B which intersect with each other as described above is focused on, the number of either of the strip conductors 57A or 57B may be larger (total area may be larger). Further, in the example shown, the number of the strip conductors 57A is larger (or the total area is larger) than that of the strip conductors 57B. For example, the number (or total area) of the strip conductors 57A is larger than 2 times of the number (or total area) of the strip conductors 57B or 5 times or more than the latter.

The plurality of strip conductors 57 for example extend from the bus conductors 55 (are connected with the bus conductors 55). Note that, in the explanation of the present embodiment, even in a configuration in which it may be considered that the strip conductors 57 and the bus conductors 55 intersect so as to configure crosses, the strip conductors 57 are expressed as extending from the bus conductors 55 (expressed as if the strip conductors 57 on opposite sides to each other across the bus conductor 55 differ from each other).

As illustrated in FIG. 5 which shows a large number of conductors, the strip conductors 57 and the bus conductors 55 which are connected to each other may extend in directions intersecting with each other (that is, the strip conductors 57B may extend from the bus conductors 55A or the strip conductors 57A may extend from the bus conductors 55B) or may extend in the mutually same directions (that is, the strip conductors 57A may extend from the bus conductors 55A or the strip conductors 57B may extend from the bus conductors 55B).

Further, for example, a plurality of strip conductors 57 are connected (intersect) with the strip conductors 57 extending from the bus conductors 55. For example, in the example in FIG. 5, one strip conductor 57B extends toward the +D1 axis direction from the bus conductor 55A extending from the terminal 9J to the −D2 direction, and a plurality of strip conductors 57A intersect this strip conductor 57B.

Further, for example, a plurality of strip conductors 57 extend from the area pattern 56 connected to the terminal 9H. Alternatively, a plurality of strip conductors 57 intersect with a strip conductor 57 extending from the area pattern 56.

Part of the plurality of strip conductors 57 may contribute to mutual electrical connection of the terminals 9 as well. For example, the plurality of strip conductors 57 positioned between the terminal 9F and the terminal 9H contribute to the connection of the two. Note that, in this example, the plurality of strip conductors 57 directly connect the bus conductors 55 connected to the terminal 9F and the area pattern 56 connected to the terminal 9H. Alternatively, the strip conductors 57 may electrically connect the terminals 9 to each other by mutually connecting the bus conductors 55 or mutually connecting the area patterns 56.

Note that, although not particularly shown, the strip conductors 57 need not be connected to the bus conductors 55, area patterns 56, terminals 9, and the other strip conductors 57 and may stand alone. Further, for example, the plurality of strip conductors 57 which are connected to each other (intersect with each other) may stand alone without being connected to any of the bus conductors 55, area patterns 56, and terminals 9.

Also the positional relationships of the plurality of strip conductors 57 may be suitably set with respect to the mutual positional relationships of the plurality of bus conductors 55 (shapes formed by plurality of bus conductors 55). For example, the bus conductor 55B extending from the terminal 9A to the −D1 direction and the bus conductor 55B extending from the terminal 9L to the −D1 direction extend alongside each other, and a plurality of strip conductors 57A are provided so as to bridge these two bus conductors 55B. Further, these plurality of strip conductors 57A, from another viewpoint, bridge the two bus conductors 55 in the internal part of the three sides or four sides of the rectangle configured by a plurality of bus conductors 55.

(Relative Position of Strip Conductors Relative to IDT Electrodes)

Figure 6A:
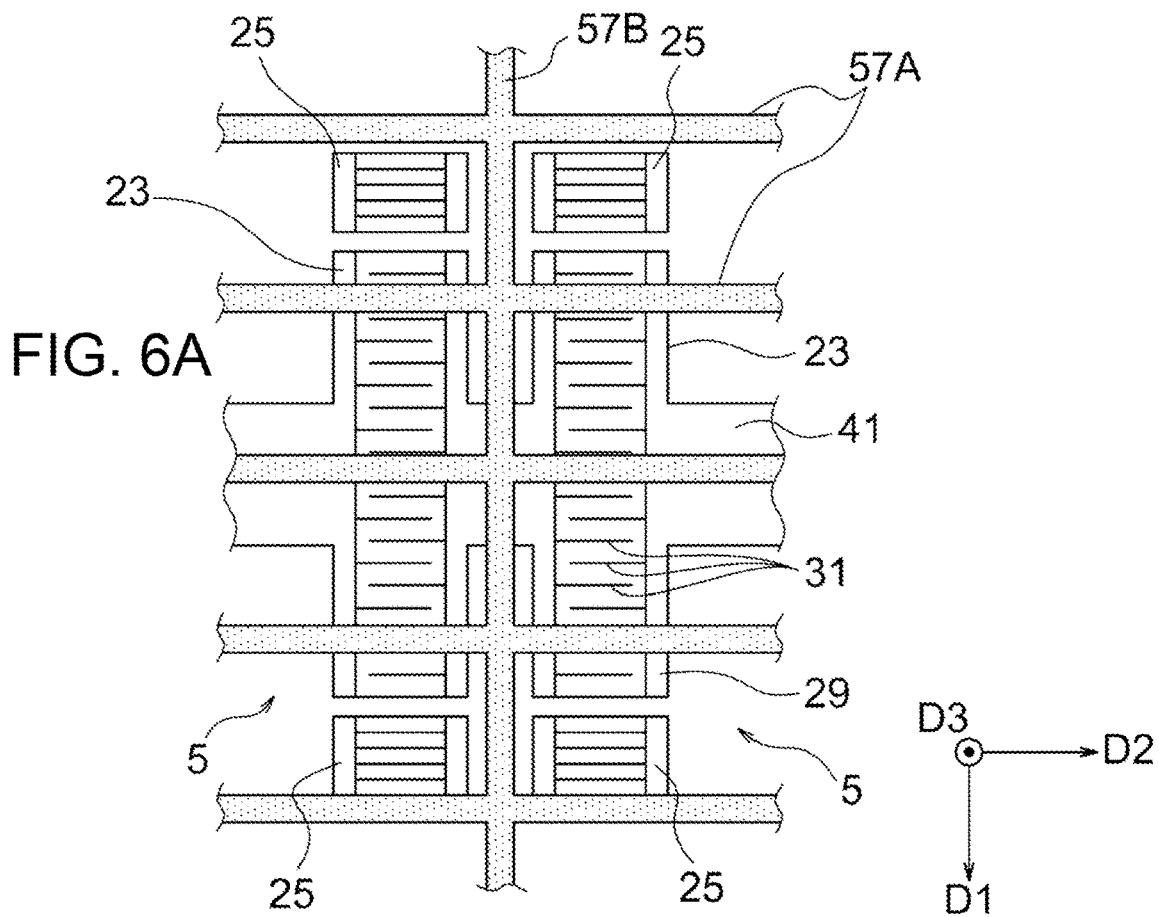
FIG. 6A is a perspective plan view showing an example of relative positions of strip conductors relative to IDT electrodes.

FIG. 6A is a perspective plan view showing one example of the relative positions of the strip conductors 57 relative to IDT electrodes 23 (SAW resonators 5).

As already explained, the strip conductors 57A extend in a direction parallel with respect to the electrode fingers 31 in the IDT electrodes 23 and in turn the plurality of strip conductors 57A are arranged in the direction of arrangement of the pluralities of electrode fingers 31. Further, the strip conductors 57B extend in a direction perpendicular with respect to the electrode fingers 31.

The plurality of strip conductors 57A are for example arranged with a pitch which is larger than the pitch of the pluralities of electrode fingers 31, but is smaller than the size in the direction of propagation of the SAW (D1 axis direction) of the IDT electrodes 23. As a result, the plurality of strip conductors 57A overlap the regions where the pluralities of electrode fingers 31 are arranged. On the other hand, the strip conductors 57B for example do not overlap regions where the pluralities of electrode fingers 31 are arranged.

Note that, regions where the pluralities of electrode fingers 31 are arranged are for example regions which are surrounded by the electrode fingers 31 on the two ends in the direction of arrangement of the pluralities of electrode fingers 31 and the edge parts of the pair of bus bars 29 on the mutually facing sides (that is, regions obtained by excluding the regions where the pairs of bus bars 29 are arranged from the regions where the IDT electrodes 23 are arranged).

More specifically, for example, two IDT electrodes 23 are connected in series, and a strip conductor 57B is positioned between them. Note that, in the example shown, two IDT electrodes 23 are connected by a wiring 41, and the strip conductor 57B is positioned on the wiring 41. However, the two IDT electrodes 23 may be directly connected with each other at their bus bars 29, and at least parts of the strip conductor 57B may overlap the bus bars 29 positioned between the two IDT electrodes 23.

These serially connected two (two or more) IDT electrodes 23 (SAW resonators 5) for example configure one serial resonator or one parallel resonator in a ladder type SAW resonator filter. That is, as the thinking in design, two SAW resonators 5 are obtained by dividing one SAW resonator into two or more. Such a division is for example advantageous for improvement of the electric power resistance.

Note that, such relative relationships need not be employed. The strip conductors 57B may overlap the regions where the pluralities of electrode fingers 31 are arranged, and/or the strip conductors 57A may be arranged so as not to overlap the regions where the pluralities of electrode fingers 31 are arranged.

(Modification of Strip Conductors)

Figure 6B:
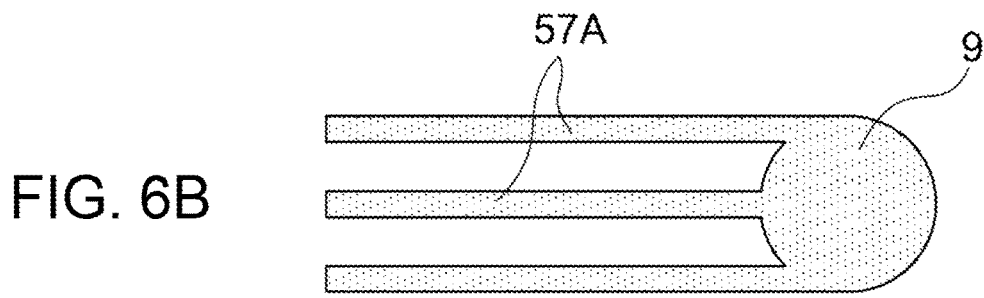
FIG. 6B is a plan view showing a modification of the strip conductors.

FIG. 6B is a plan view showing a modification of the strip conductors 57. As shown in this view, the strip conductors 57 may extend from the terminal 9 as well. Note that, in the example shown, the end parts of the strip conductors 57 on the opposite side to the terminal 9 are not connected to other conductors. Naturally, these end parts on the opposite side may be connected to another terminal 9, bus conductor 55, area pattern 56, or strip conductor 57 (here, 57B) extending in a direction perpendicular to the shown strip conductors 57 (here, 57A) as well. Further, a not shown other strip conductor 57 (here, 57B) may intersect positions at the middle of the illustrated strip conductors 57 (here, 57A).

(Size Relationship of Width and Thickness of Strip Conductor)

Figure 6C:
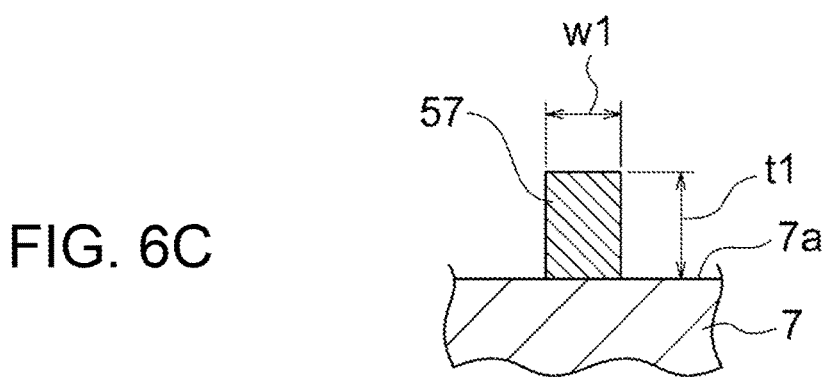
FIG. 6C is a cross-sectional view taken along the VIc-VIc line in FIG. 5.

FIG. 6C is a cross-sectional view taken along the VIc-VIc line in FIG. 5.

The thickness t1 of a strip conductor 57 (reinforcing layer 11) is for example larger than the width w1 of the strip conductor 57. For example, the thickness t1 is larger by 1 μm or more or by 4 μm or more compared with the width w1. Further, from another viewpoint, for example, the thickness t1 is larger than the width w1 by 5% or more or by 20% or more of the width w1. As one example, for example, the width w1 is about 20 μm, and the thickness t1 is about 25 μm. However, the thickness t1 may be made equal to the width w1 or may be made smaller than the width w1.

As described above, in the present embodiment, the SAW device 1 has a piezoelectric substrate 13, a support substrate 15 which is bonded to a lower surface of the piezoelectric substrate 13 and has a smaller thermal expansion coefficient than that of the piezoelectric substrate 13, an IDT electrode 23 positioned on the piezoelectric substrate 13, a cover 7 forming a space 21 above the IDT electrode 23, and a plurality of strip conductors 57 which extend alongside each other on the cover 7 and at least parts of which overlap the space 21 in a plane perspective.

Accordingly, for example, the thermal expansion of the piezoelectric substrate 13 is suppressed by the support substrate 15 and in turn the change of electrical characteristics caused by the temperature change is suppressed. That is, a temperature compensation effect is obtained. Further, for example, the rigidity of the cover 7 is reinforced by the plurality of strip conductors 57, whereby it is possible to reduce the possibility of warping of the cover 7 to the space 21 side.

Here, the reinforcing layer (conductor) generally has a larger thermal expansion coefficient than that of the piezoelectric substrate 13. Further, it has a relatively larger Young's modulus (for example larger than the cover 7). Accordingly, for example, in a case where a solid patterned reinforcing layer is provided on the upper surface 7a of the cover 7, there is a possibility of application of tensile stress to the piezoelectric substrate 13 due to the thermal expansion of the reinforcing layer. As a result, there is a possibility of reduction of the temperature compensation effect by the support substrate 15.

However, in the SAW device 1, the reinforcing layer 11 is configured by the plurality of strip conductors 57. Therefore, compared with the aspect in which the solid patterned reinforcing layer is provided, the probability of reduction of the effect by the support substrate 15 is reduced. Further, for example, the reinforcing layer 11 becomes larger in surface area relative to volume compared with the solid patterned reinforcing layer, therefore the efficiency of heat dissipation with respect to the volume is improved.

In the present embodiment, the SAW device 1 further has the bus conductors 55 which extend on the cover 7 with broader widths than the plurality of strip conductors 57. The plurality of strip conductors 57 extend from the bus conductors 55.

Accordingly, for example, the plurality of strip conductors 57 are supported upon the bus conductors 55, therefore the effect of reinforcement of the cover 7 by the plurality of strip conductors 57 increases. Further, for example, due to connection of the plurality of strip conductors 57 with the bus conductors 55 which have relatively large cross-sectional areas and easily transfer heat, it becomes easier to transfer heat among the plurality of strip conductors 57, therefore it becomes easier to perform equal (efficient) heat dissipation from the plurality of strip conductors 57 by eliminating unevenness of heat.

In the present embodiment, as illustrated in the vicinities of the terminals 9A and 9L, the SAW device 1 further has one bus conductor 55 and another bus conductor 55 which extends alongside this one bus conductor 55 and which has a broader width than the plurality of strip conductors 57. The plurality of strip conductors 57 bridge the above two bus conductors 55.

Accordingly, for example, the plurality of strip conductors 57 are supported at their two ends by the bus conductors 55, therefore the effect of reinforcement of the cover 7 by the plurality of strip conductors 57 further increases. Further, the effect of transferring heat among the plurality of strip conductors 57 is improved and in turn also the heat dissipation is improved.

In the present embodiment, the SAW device 1 has the plurality of strip conductors 57 (57A in the present embodiment) which extend alongside each other and one or more strip conductors 57B which intersect with the plurality of strip conductors 57A. Among these mutually intersecting plurality of strip conductors 57A and one or more strip conductors 57B, the number of the one or more strip conductors 57B is less than ½ of the number of the plurality of strip conductors 57A.

Accordingly, for example, by the mutual connection of the plurality of strip conductors 57A by one or more strip conductors 57B, heat becomes easier to be transferred among the plurality of strip conductors 57A, therefore the heat dissipation effect can be improved by eliminating the unevenness of heat. This is confirmed by simulation and computation carried out by the inventors of the present application, although it is not particularly shown. On the other hand, by the number of the strip conductors 57B being made relatively smaller, for example, the tensile stress in the direction of extension of the strip conductors 57B which is generated in the piezoelectric substrate 13 due to the thermal expansion of the strip conductors 57B is reduced.

Note that, consider a mode using the strip conductors 57A and 57B to configure a meandering inductor (this may also be included in the art according to the present disclosure as well). In this inductor, when the inductor is partitioned so that the number of the strip conductors 57B becomes the smallest relative to the number of the strip conductors 57A, a combination of one strip conductor 57B and two strip conductors 57A is extracted. That is, even if the inductor is partitioned so that the number of the strip conductors 57B becomes the smallest relative to the number of the strip conductors 57A, the number of the strip conductors 57B is ½ of the number of the strip conductors 57A. Accordingly, the number of the strip conductors 57B being less than ½ of the number of the strip conductors 57A also shows a difference from a meandering inductor.

In the present embodiment, the excitation electrode is the IDT electrode 23 which has the pluralities of electrode fingers 31 extending alongside each other. Between the strip conductors 57A and 57B, the strip conductors 57A having a relatively larger number extend in the direction in which the pluralities of electrode fingers 31 extend.

That is, the number of the strip conductors 57B which intersect (for example perpendicularly interest) to the pluralities of electrode fingers 31 is made small. Due to this, for example, the tensile stress applied from the reinforcing layer 11 (strip conductors 57B) to the piezoelectric substrate 13 in the direction of propagation of the SAW is reduced. On the other hand, in the expansion of the piezoelectric substrate 13, particularly expansion in the direction of propagation of the SAW exerts an influence upon the electrical characteristics of the SAW device 1. Accordingly, for example, lowering of the temperature compensation effect by the support substrate 15 is effectively reduced.

In the present embodiment, as described above, one or more strip conductors 57B which intersect with the plurality of strip conductors 57A and have a relatively smaller number for example do not overlap the pluralities of electrode fingers 31 in a plane perspective.

Accordingly, for example, the probability of occurrence of unwanted electrical coupling between the strip conductors 57B and the IDT electrode 23 is reduced. That is, the probability of the strip conductors 57B exerting an influence upon the characteristics of the SAW device 1 is reduced. The number of the strip conductors 57B is small, therefore such an arrangement becomes possible.

In the present embodiment, the plurality of strip conductors 57 are larger in thicknesses than widths.

Accordingly, for example, the strip conductors 57 are made relatively larger in the second moment of area concerning flexural deformation to the space 21 side relative to its cross-sectional area. As a result, for example, the effect of reduction of the probability of warping of the cover 7 to the space 21 side can be kept while the thermal stress exerted with respect to the piezoelectric substrate 13 in the surface direction thereof can be reduced.

In the present embodiment, the SAW device 1 further has connection conductors (for example, the wiring 41, pads 43, via conductors 45, terminals 9, and bus conductors 55) with at least parts positioned in the cover 7 and which connect the IDT electrode 23 and the plurality of strip conductors 57.

Accordingly, for example, a heat transfer route is configured from the IDT electrode 23 to the strip conductors 57. As a result, in the IDT electrode 23, the change in characteristics caused by the temperature change is reduced. Further, for example, in a case where the strip conductors 57 are connected to the terminal 9 given the reference potential, the volume of the conductor given the reference potential becomes larger, therefore the reference potential is stabilized. As a result, for example, the characteristics of the SAW device 1 are improved.

Further, in the present embodiment, in the SAW device 1, the plurality of strip conductors 57B are connected to one bus conductor 55B. Further, these plurality of strip conductors 57A are arranged at substantially the same pitches.

Accordingly, the strip conductors 57A function like beams, therefore deformation of the lid 19 to the space 21 side can be suppressed. Further, due to the strip conductors 57A being arranged at an equal pitch, stress from an external part can be dispersed, therefore the reliability of the SAW device 1 can be raised.

Further, from the configuration explained above, even if the distance between two or more strip conductors 57A becomes larger compared with the widths of the strip conductors 57A, deformation of the lid 19 can be suppressed. Further, by making the distance between two or more strip conductors 57A larger compared with the widths of the strip conductors 57A, the thermal stress exerted with respect to the piezoelectric substrate 13 in its surface direction can be reduced.

In the present embodiment, from another viewpoint, the SAW device 1 has a piezoelectric substrate 13, an IDT electrode 23 positioned on the piezoelectric substrate 13, a cover 7 covering the IDT electrode 23, via conductors 45 which penetrate through at least the upper surface 7a side part in the cover 7 and are electrically connected with the IDT electrode 23, terminals 9 (for example, terminals 9L, 9B, 9D, 9F, 9I, or 9J) which are positioned on the cover 7 and are separated from the via conductors 45 when viewed on a plane, and a reinforcing layer 11 which is positioned on the cover 7 and connects the via conductors 45 and the terminals 9 which are separated from the via conductors 45 described above. The reinforcing layer 11 has bus conductors 55A and 55B which extend in directions intersecting with each other starting from terminals 9 separated from the via conductors 45.

Accordingly, for example, the probability of deformation or breakage of the SAW device 1 at the time when a force in the surface direction (D1 axis direction and/or D2 axis direction) is applied to the mounted SAW device 1 is reduced. That is, the shearing stress resistance can be improved. Specifically, this is as follows.

The SAW device 1 is for example mounted on a not shown circuit board by bonding of the plurality of terminals 9 and the circuit board by not shown bumps. Accordingly, if force in the surface direction is applied to the SAW device 1 being mounted, this force will be applied to the plurality of terminals 9. Here, for example, the terminals 9 on the via conductors 45 receive reaction force from the via conductors 45 having a larger Young's modulus than the cover 7, therefore seldom displace in the surface direction relative to the piezoelectric substrate 13 or the cover 7. On the other hand, in the terminals 9 separated from the via conductors 45, such a reaction force is not obtained, therefore displacement relative to the piezoelectric substrate 13 or cover 7 is easily caused. As a result, in the terminals 9 which are separated from the via conductors 45 and their peripheries, deformation or breakage is liable to occur. For example, the terminals 9 end up deviating from the original positions on the cover 7. Consequently, for example, there is a possibility of causing short-circuiting or disconnection.

However, in the present embodiment, the bus conductors 55A and 55B extend from the terminals 9 separated from the via conductors 45 in directions intersecting with each other. The bus conductors 55A closely contact the cover 7 over relatively long distances in their direction of extension (D2 axis direction), therefore do not displace much at all in the direction of extension. Since such bus conductors 55A extend starting from the terminals 9, the terminals 9 are kept from displacing in the direction of extension of the bus conductors 55A. In the same way, the terminals 9 separated from the via conductors 45 are kept from displacing in the direction of extension of the bus conductors 55B (D1 axis direction). As a result, the terminals 9 separated from the via conductors 45 are kept from displacing in the surface direction. Consequently, deformation or breakage in the terminals 9 and their peripheries is suppressed.

In the present embodiment, the reinforcing layer 11 further has for example a bus conductor 55B which extends alongside the bus conductor 55B extending from the terminal 9L and is connected with the bus conductor 55A extending from the terminal 9L (this connection may be made through or may not be made through a terminal 9 and is made through the terminal 9A in the present embodiment). That is, the bus conductors 55A and 55B are provided so that three sides of a rectangle are formed.

Accordingly, for example, displacement in the surface direction of the terminal 9L is accompanied by deformation of the three sides in the rectangle (for example deformation where the angles formed by two sides are changed). As a result, for example, the terminal 9L can more easily obtain the reaction force from the reinforcing layer 11. In turn, the shearing stress resistance is further improved. In particular, this effect increases when the bus conductors 55A and the bus conductors 55B are provided so that four sides of a rectangle are formed.

In the present embodiment, the reinforcing layer 11 for example has a plurality of strip conductors 57A which extend from the bus conductor 55B of the bus conductor 55A and bus conductor 55B which extend from the terminal 9L and are narrower in width than the bus conductors 55A and 55B.

Accordingly, for example, displacement of the terminal 9L is further suppressed in the direction of extension of the strip conductors 57A. Further, compared with a case where a plurality of bus conductors 55A extend from the bus conductor 55B, the area of the reinforcing layer 11 can be made smaller. As a result, for example, tensile stress caused in the piezoelectric substrate 13 due to the thermal expansion of the reinforcing layer 11 can be reduced and in turn the probability of change of the characteristics of the SAW device 1 can be reduced. This effect becomes remarkable when the plurality of strip conductors 57 are arranged in the direction of propagation of the SAW.

In the present embodiment, for example, the reinforcing layer 11 has a plurality of strip conductors 57A which bridge the bus conductor 55B extending from the terminal 9L and the bus conductor 55B (extending from the terminal 9A) extending alongside the former bus conductor 55B and are narrower in width than the bus conductors 55A and 55B.

Accordingly, for example, displacement in the surface direction of the terminal 9L is accompanied with deformation of the shape formed by the pair of bus conductors 55B and the plurality of strip conductors 57A. As a result, for example, the terminal 9L more easily obtains the reaction force from the reinforcing layer 11. Further, compared with the case where the plurality of bus conductors 55A bridge the pair of bus conductors 55B, the area of the reinforcing layer 11 can be made smaller.

In the present embodiment, the SAW device 1 further has the support substrate 15 which is bonded to the lower surface of the piezoelectric substrate 13 and has a smaller thermal expansion coefficient than that of the piezoelectric substrate 13. The reinforcing layer 11 has a configuration including the bus conductors 55.

Accordingly, for example, in the same way as the effect due to configuring the reinforcing layer 11 by the plurality of strip conductors, compared with the case where a solid patterned reinforcing layer is provided, the probability of reduction of the temperature compensation effect of the support substrate 15 by the reinforcing layer 11 is reduced.

Note that, in the first embodiment, the SAW device 1 is one example of an acoustic wave device. The IDT electrode 23 is one example of an excitation electrode. The strip conductor 57A is one example of a first strip conductor. The strip conductor 57B is one example of a second strip conductor. The bus conductors 55B are examples of a first bus conductor and second bus conductor. The reinforcing layer 11 is one example of a conductor layer. The bus conductor 55A or 55B is one example of a first extension part to fourth extension part.

Further, in the example explained above, the pads 43 are electrically led out up to the upper surface of the cover 7 by the via conductors 45 penetrating through the cover 7. However, the present disclosure is not limited to this. For example, the cover 7 may be arranged so that the pads 43 are positioned outside of the outer circumferential edge of the cover 7, and lead-out electrodes that continuously cover single parts of the outer side surface of the cover 7 from the upper surfaces of the pads 43 up to the upper surface of the cover 7 may be provided. In this case, the cover 7 can be reinforced by the lead-out electrodes, and entry of moisture etc. can be prevented.

Figure 13:
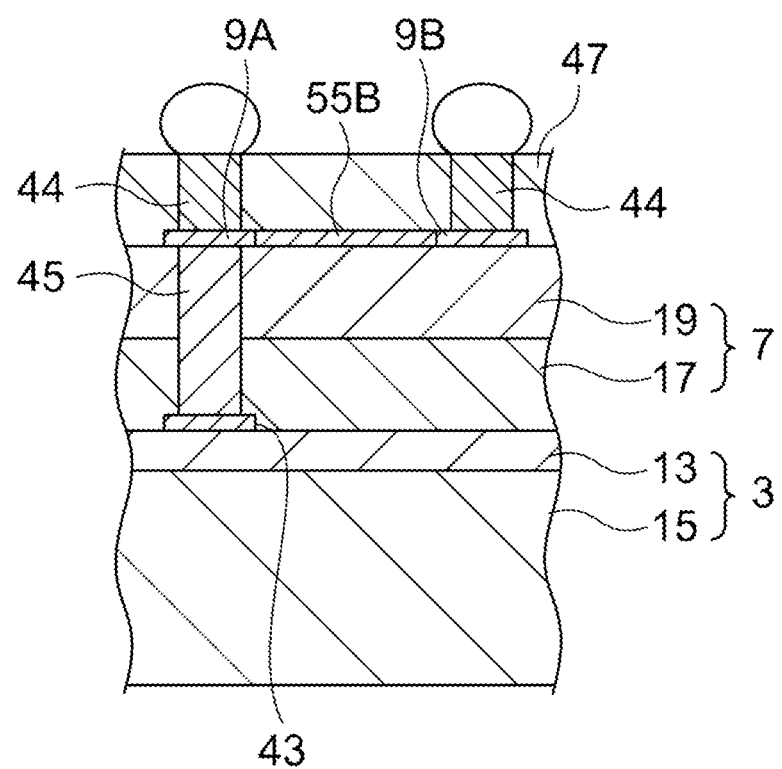
FIG. 13 is a partial cross-sectional view of a SAW device according to a modification.

Further, in the explanation given above, a configuration forming solder etc. on the terminals 9 and thereby mounting the SAW device 1 on the circuit board was explained. However, the present disclosure is not limited to this. FIG. 13 shows a modification of the SAW device 1. FIG. 13 is a cross-sectional view at a position corresponding to the XIII-XIII line in FIG. 5.

As shown in FIG. 13, on the lid 19, an insulation layer 47 which is relatively thick may be provided as well. In this case, for example, the insulation layer 47 may be provided with a height (thickness) equal to or more than the space 21 as well. The insulation layer 47 is for example formed by a solder resist in the same way as FIG. 4.

Further, by providing upper via conductors 44 which are positioned on the terminals 9 and penetrate through the insulation layer 47 in the thickness direction and forming solder on these upper via conductors 44, mounting on the circuit board can be facilitated as well.

In this case, stress is transferred from the solder through the upper via conductors 44 to the terminals 9. Further, when there are via conductors 45 just under the terminals 9, there area series of via conductors (45, 44) above and below the terminals 9, therefore it is possible to counter stress applied to the terminals 9 in the surface direction.

On the other hand, where the terminals 9 are separated from the via conductors 45, that is, when there are no via conductors 45 just under the terminals 9 and only upper via conductors 44 are positioned just above the terminals 9, the force acting against stress which is applied to the terminals 9 in the surface direction becomes weak. However, the bus conductors 55A and 55B extend starting from the terminals 9, therefore the force acting against stress which is applied to the terminals 9 in the surface direction can be raised by the bus conductors 55.

Note that, when mounting a SAW device 1 having the configuration shown in FIG. 13 on a circuit board and conducting a die shear test, neither peeling of the terminals 9 nor peeling of the insulation layer 47 and the cover 7 were caused. Contrary to this, as a SAW device in a comparative example, a device different from the SAW device 1 only in the point that bus conductors 55 extending from the terminals 9 were not provided and made the same as the SAW device 1 shown in FIG. 13 in other points was prepared. In the SAW device in the comparative example, as a result of the same test, the terminals 9 at the positions away from the via conductors 45 peeled off from the cover 7 and peeling of the insulation layer 47 and the cover 7 occurred. From the above result, it was confirmed that the reliability of the SAW device 1 could be raised by the bus conductors 55.

Second Embodiment

Figure 7:
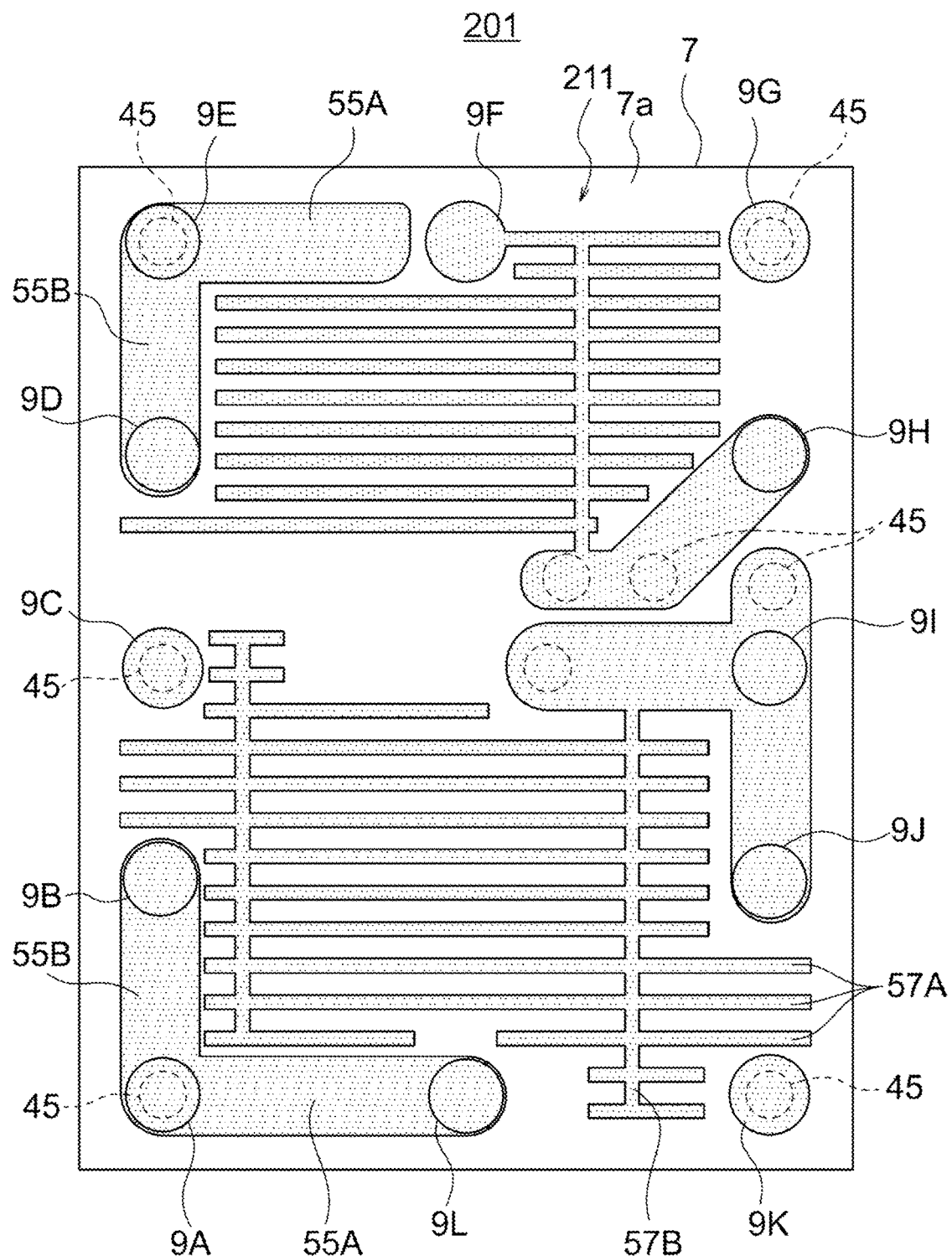
FIG. 7 is a plan view showing the configuration of a SAW device according to a second embodiment.

FIG. 7 is a plan view showing the configuration of a SAW device 201 according to a second embodiment. This view corresponds to FIG. 5 for the first embodiment The SAW device 201 differs in the specific shape of the reinforcing layer from the SAW device 1 and is the same in other points. A reinforcing layer 211 in the SAW device 201, compared with the reinforcing layer 11 in the SAW device 1, is decreased in the number of bus conductors 55. Further, along with this, the regions where the pluralities of strip conductors 57 are arranged are made broader than those in the first embodiment.

Third Embodiment

Figure 8:
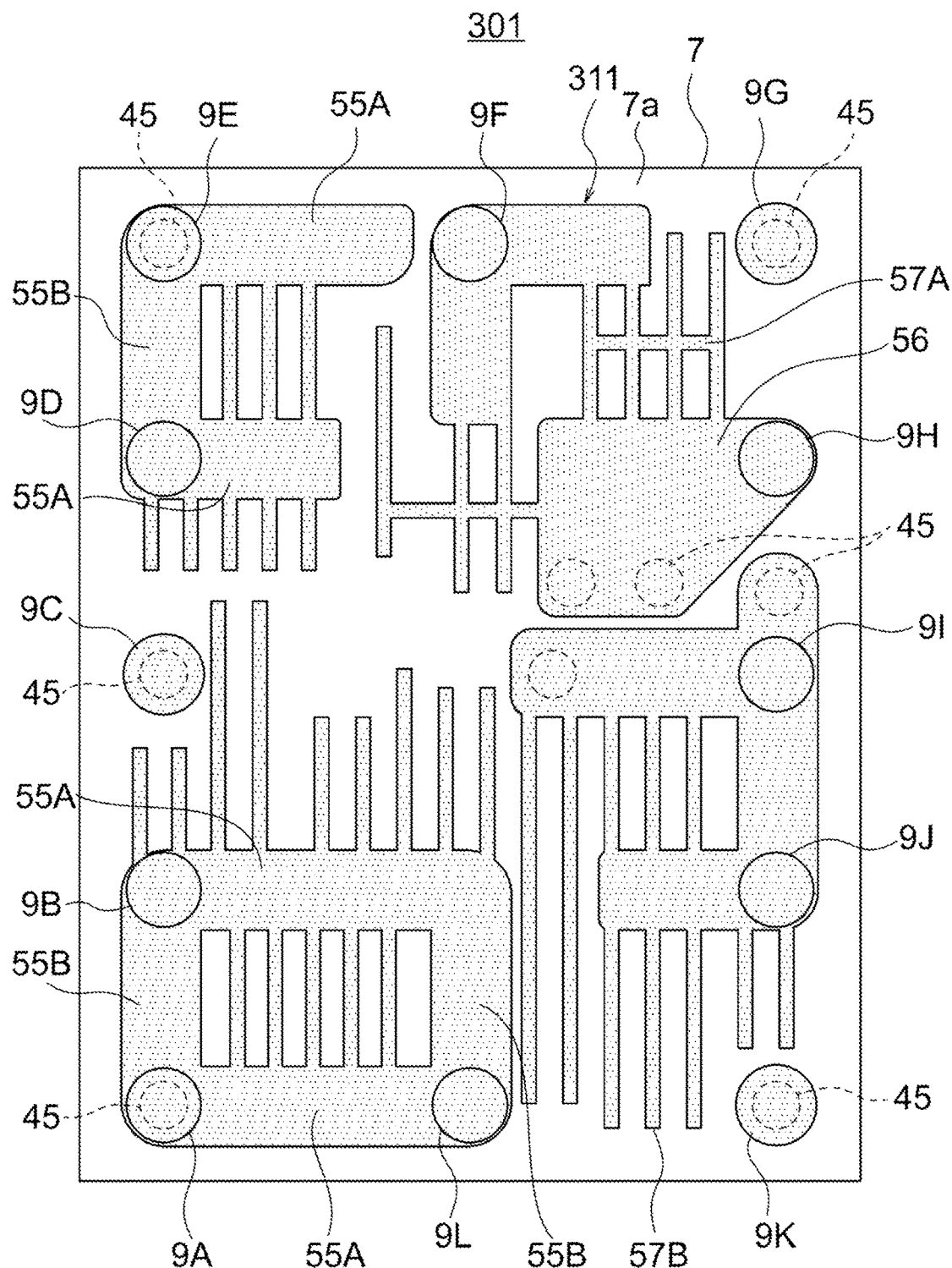
FIG. 8 is a plan view showing the configuration of a SAW device according to a third embodiment.
Figure 8:
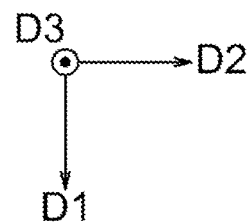

FIG. 8 is a plan view showing the configuration of a SAW device 301 according to a third embodiment. This view corresponds to FIG. 5 for the first embodiment.

The SAW device 301 differs in the specific shape of the reinforcing layer from the SAW device 1 and is the same in other points. In the reinforcing layer 11 in the SAW device 1, the number of the strip conductors 57A was made larger than the number of the strip conductors 57B. Contrary to this, in a reinforcing layer 311 in the SAW device 301, the number of the strip conductors 57B is made larger than the number of the strip conductors 57A. Note that, in the SAW device 301, the arrangement of the bus conductors 55 is the same as that in the SAW device 1.

Fourth Embodiment

Figure 14:
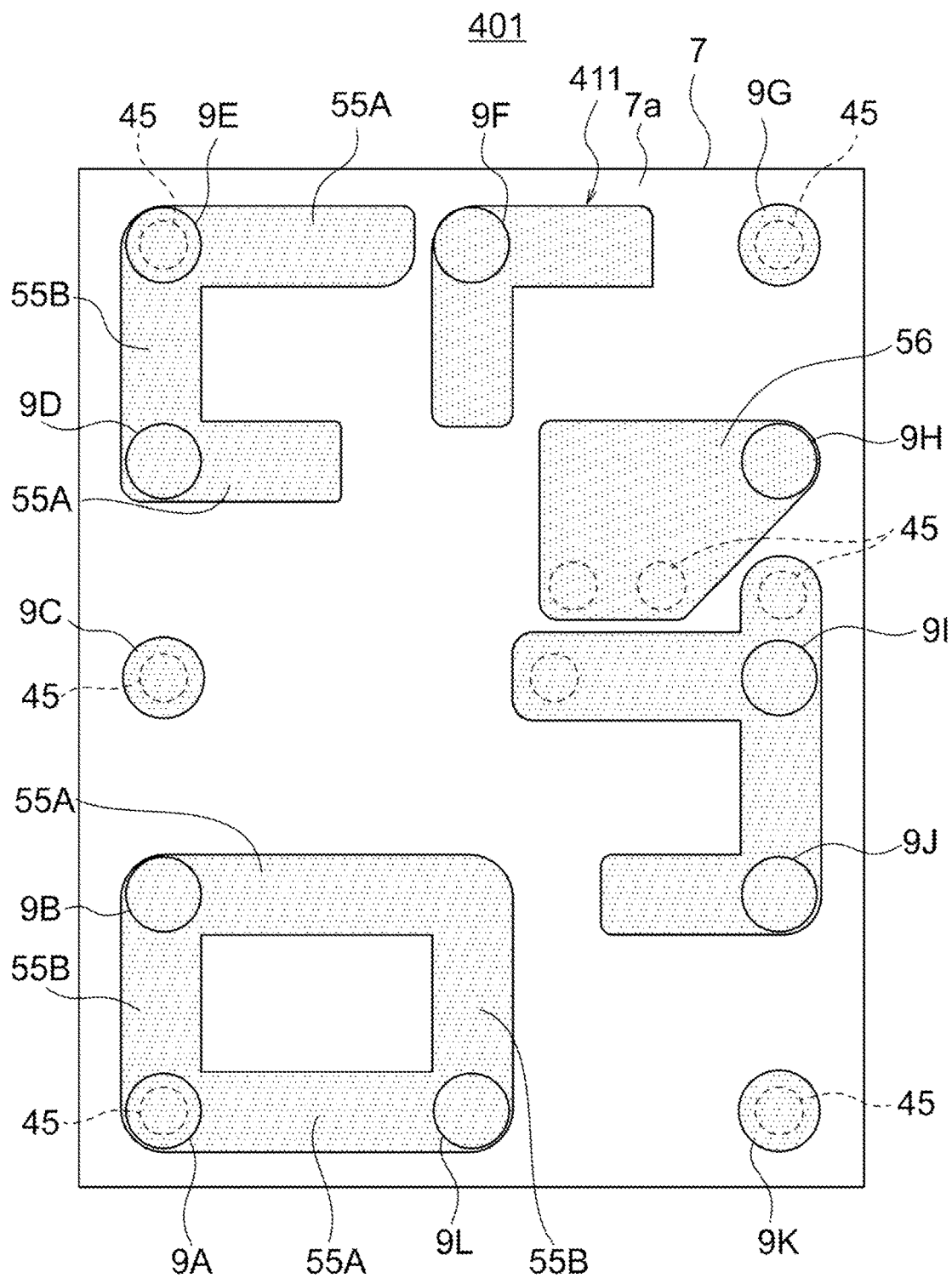
FIG. 14 is a plan view showing the configuration of a SAW device according to a fourth embodiment.

FIG. 14 is a plan view showing the configuration of a SAW device 401 according to a fourth embodiment. This view corresponds to FIG. 5 for the first embodiment.

The SAW device 401 differs in the specific shape of the reinforcing layer from the SAW device 1 and is the same in other points. A reinforcing layer 411 in the SAW device 401 has a shape of the reinforcing layer 11 in the SAW device 1 with the plurality of strip conductors 57 omitted.

Even in such a configuration, due to the provision of the bus conductors 55A and 55B which extend in directions intersecting with each other starting from the terminals 9 separated from the via conductors 45, for example, the shearing stress resistance is improved.

(Modification of Via Conductor)

Figure 15:
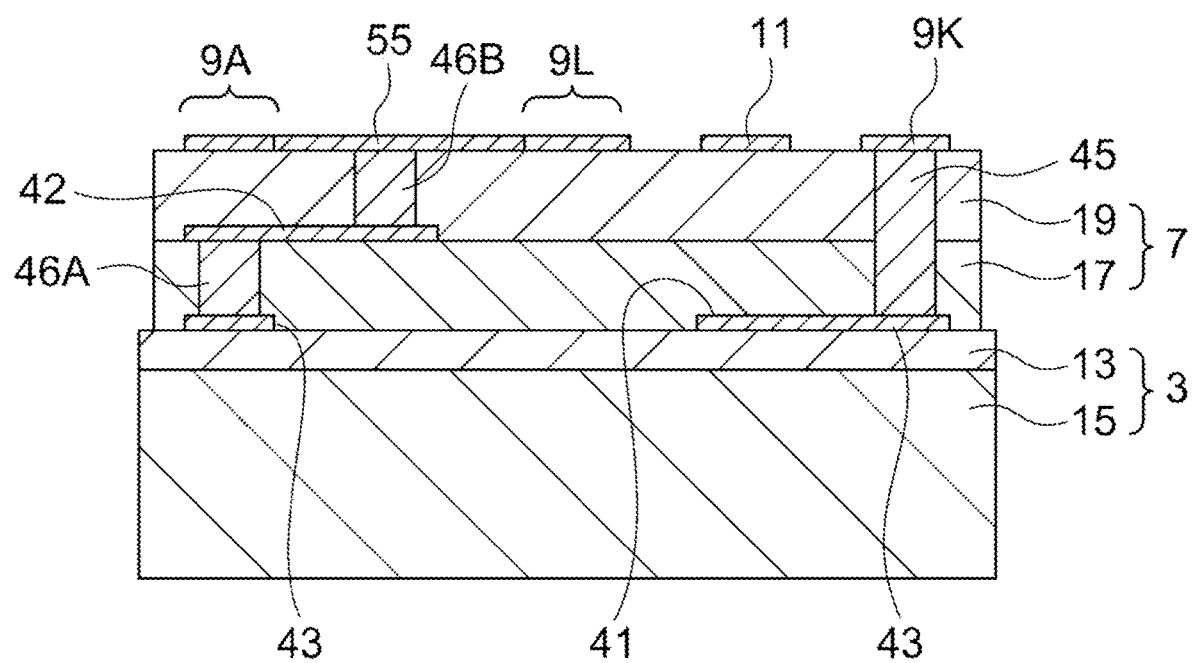
FIG. 15 is a cross-sectional view showing a modification of a via conductor.

FIG. 15 is a cross-sectional view showing a modification of a via conductor. This view corresponds to FIG. 4A.

As shown on the left side on the drawing sheet, the via conductor 45 penetrating through the entirety of the cover 7 need not be provided. Instead, a via conductor 46A penetrating through the frame 17 (from another viewpoint, the lower surface side part of the cover 7), a via conductor 46B penetrating through the lid 19 (from another viewpoint, the upper surface side part of the cover 7), and internal wiring 42 connecting the via conductors 46A and 46B may be provided.

The via conductor 46A is for example positioned on a pad 43. The via conductor 46B is separated from the via conductor 46A when viewed on a plane. The internal wiring 42 is configured by a layered conductor which extends parallel to the upper surface 13a of the piezoelectric substrate 13 between the frame 17 and the lid 19 (from another viewpoint, in the cover 7). The terminal 9, as in the example shown, may be connected through the reinforcing layer 11 (for example, the bus conductor 55) with the via conductor 46B or may be provided on the via conductor 46B and connected with the via conductor 46B unlike the illustration.

By using such via conductors 46A and 46B and wiring 42, the restriction on the position where the via conductor (46B) and the reinforcing layer 11 (bus conductor 55) are connected due to the position of the pad 43 on the piezoelectric substrate is eased. As a result, for example, the via conductor 46B can be arranged at a suitable position so that displacement of the bus conductor 55 can be suppressed by the via conductor 46B. In turn, improvement of shearing stress resistance is facilitated.

<Multiplexer>

Figure 9:
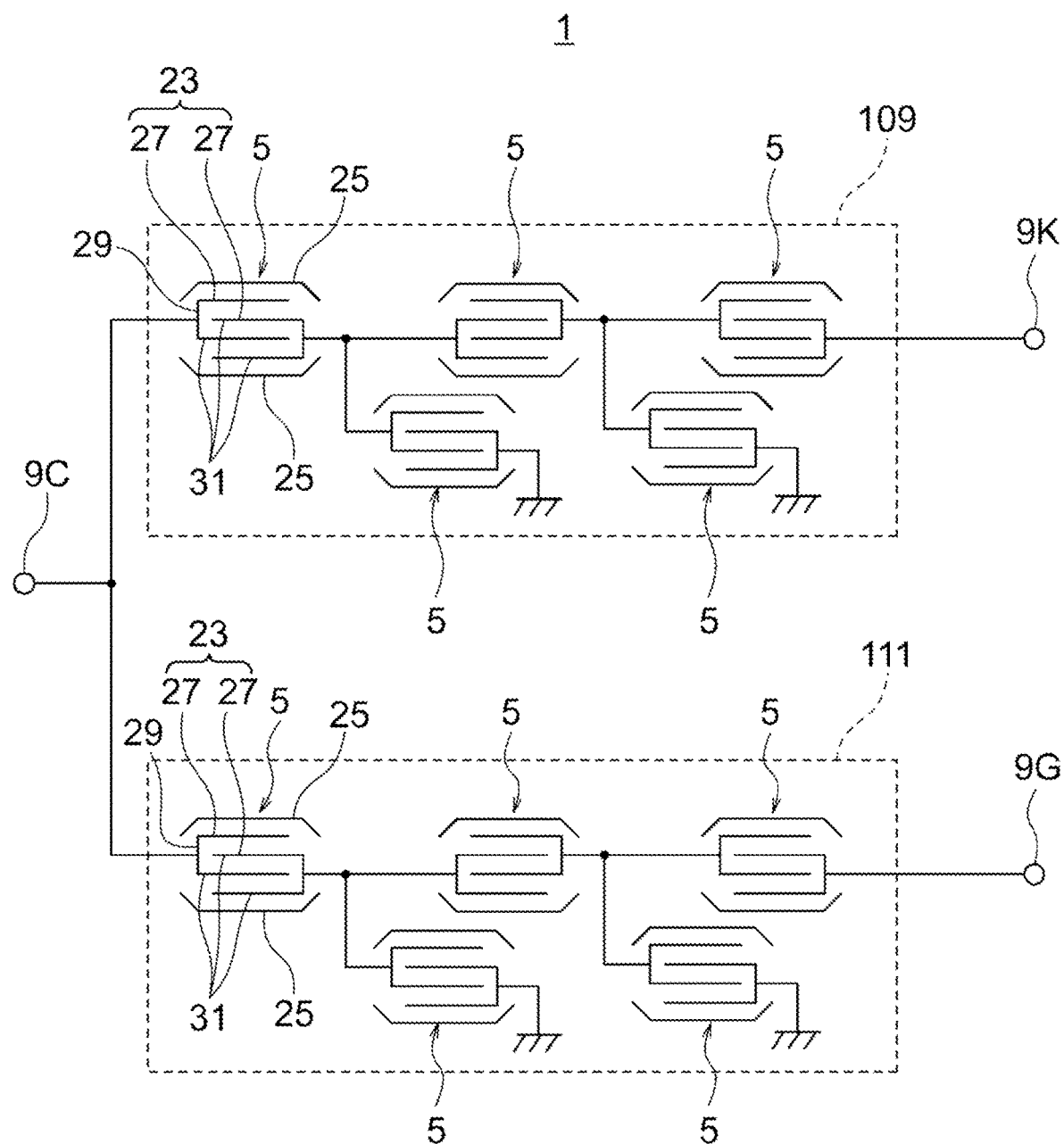
FIG. 9 is a circuit diagram schematically showing the configuration of a multiplexer configured by a SAW device.

FIG. 9 is a circuit diagram schematically showing the configuration of the SAW device 1 (or 201, 301, or 401) in a case where the SAW device 1 is a multiplexer. As understood from the notation shown at the top left of the drawing sheet in this diagram, the comb-shaped electrodes 27 are schematically shown by two-prong fork shapes in this diagram.

The multiplexer 101 for example has a transmission filter 109 which filters a transmission signal from the transmission terminal (for example 9K) and outputs the result to an antenna terminal (for example 9C) and a receiving filter 111 which filters a reception signal from the antenna terminal 9C and outputs the result to a reception terminal (for example 9G).

Each of the transmission filter 109 and receiving filter 111 is for example configured by a ladder type SAW resonator filter configured by a plurality of SAW resonators 5 connected in a ladder shape. For example, the transmission filter 109 has a plurality of (may be one) SAW resonators 5 (so-called serial resonators) which are connected in series between the transmission terminal 9K and the antenna terminal 9C and a plurality of (may be one) SAW resonators 5 (so-called parallel resonators) which connect that serial line and the reference potential.

Note that, although not particularly shown, the transmission filter 109 and/or receiving filter 111 may be a filter other than a ladder type filter as well. For example, these filters may be longitudinal coupled multimode (including double mode) type SAW resonator filters as well. In this multimode type filter, for example, a plurality of IDT electrodes 23 are arranged adjacent to each other in the direction of propagation of the SAW, and a pair of reflectors 25 are provided on the two sides of that.

<Communication Apparatus>

Figure 10:
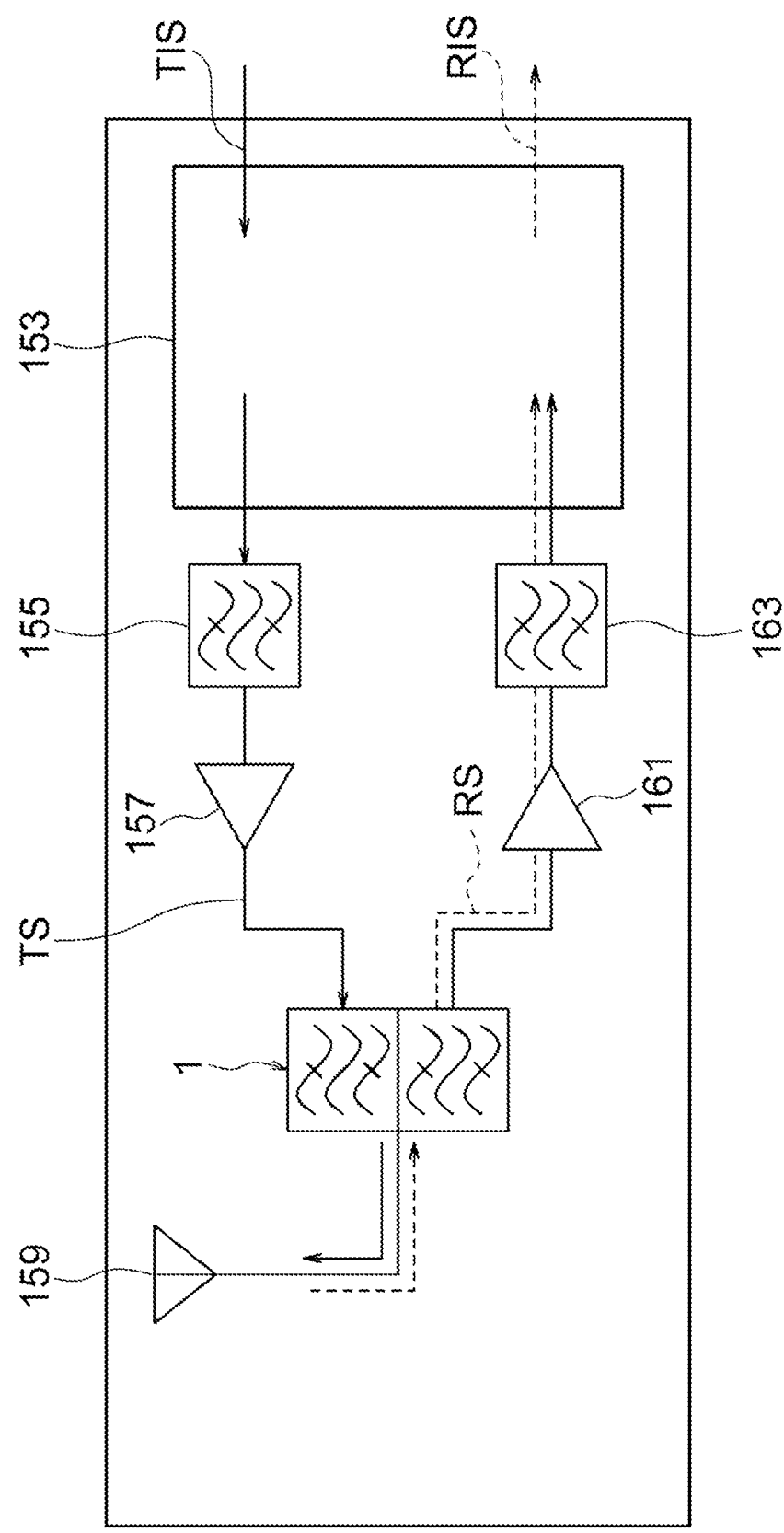
FIG. 10 is a schematic view showing a communication apparatus as an example of utilization of the multiplexer.

FIG. 10 is a block diagram showing the principal part in a communication apparatus 151 as an example of utilization of the SAW device 1 (multiplexer). The communication apparatus 151 performs wireless communication utilizing radio waves and includes the SAW device 1.

In the communication apparatus 151, a transmission information signal (TIS) including information to be transmitted is modulated and raised in frequency (conversion to a high frequency signal having a carrier frequency) by an RF-IC (radio frequency integrated circuit) 153 to become a transmission signal TS. The transmission signal TS is stripped of unwanted components other than the transmission-use passing band by a band pass filter 155, is amplified by an amplifier 157, and is input to the SAW device 1 (transmission terminal 9K). Further, the SAW device 1 strips the unwanted components other than the transmission-use passing band from the input transmission signal TS and outputs the transmission signal TS after stripping from the antenna terminal 9C to an antenna 159. The antenna 159 converts the input electrical signal (transmission signal TS) to a wireless signal (radio wave) and transmits the result.

Further, in the communication apparatus 151, a wireless signal (radio wave) received by the antenna 159 is converted to an electrical signal (reception signal RS) by the antenna 159 and is input to the SAW device 1 (antenna terminal 9C). The SAW device 1 strips the unwanted components other than the reception-use passing band from the input reception signal RS and outputs the result to an amplifier 161. The output reception signal RS is amplified by the amplifier 161 and is stripped of unwanted components other than the reception-use passing band by the band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the wireless signal may be one according to various standards. The modulation scheme may be either of phase modulation, amplitude modulation, frequency modulation, or a combination of any two or more among them. As the circuit system, FIG. 10 illustrated a direct conversion system. However, a suitable system other than that may be employed. For example, it may be a double superheterodyne system as well. Further, FIG. 10 schematically shows only the principal part. A low pass filter or isolator etc. may be added to suitable positions. Further, the positions of the amplifier etc. may be changed as well.

Example and Comparative Examples

Prototypes of SAW devices according to examples and comparative examples were produced and characteristics thereof were checked. The results are shown below.

Figure 11A:
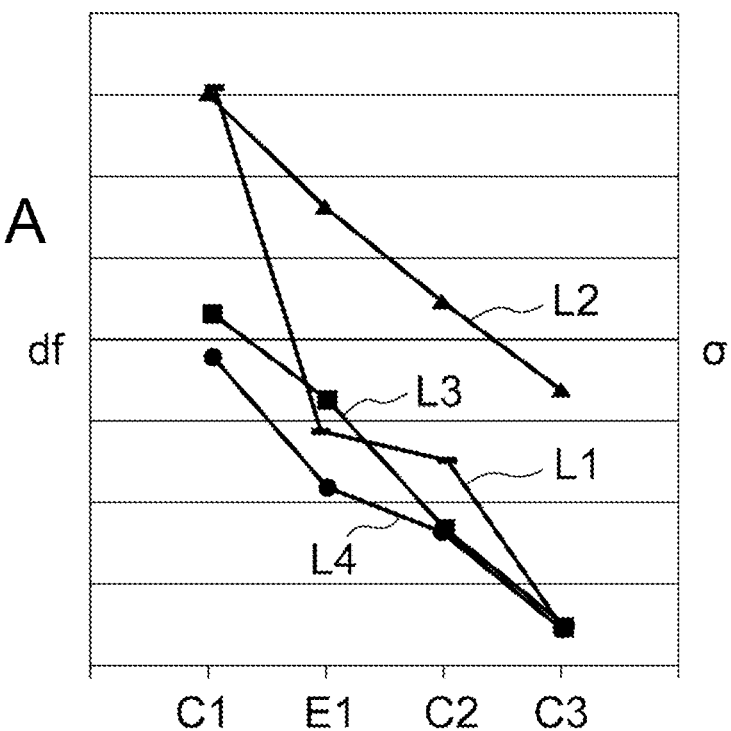
FIG. 11A and FIG. 11B are graphs showing changes of the characteristics caused by temperature changes in the SAW devices in an example and comparative examples.
Figure 11B:
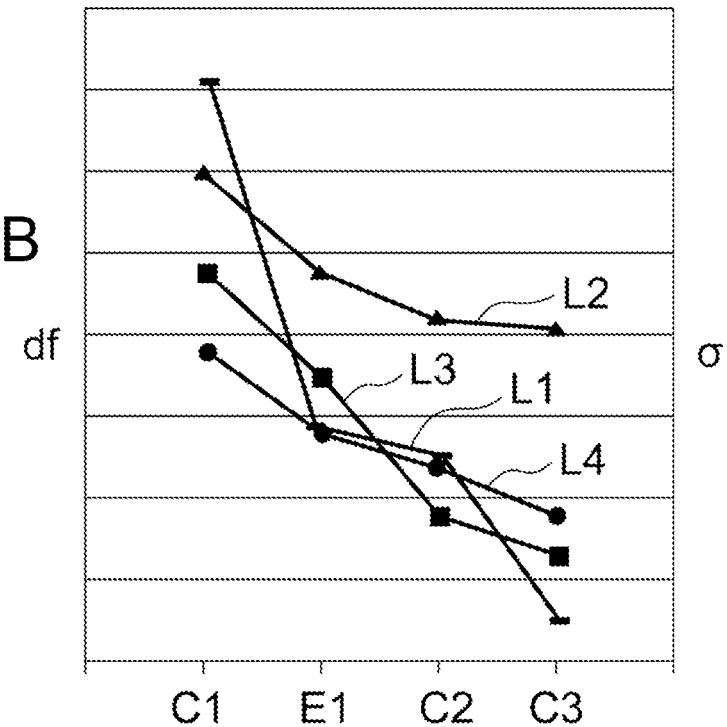

FIG. 11A and FIG. 11B are graphs showing changes of the characteristics due to temperature changes in the SAW devices in an example and comparative examples. FIG. 11A shows the results when the temperatures on the periphery of the SAW devices were changed from −25° C. to 85° C. FIG. 11B shows the results when changing the ambient temperatures of the SAW devices from 25° C. to 85° C.

"E1" plotted on the abscissas corresponds to the example, while "C1" to "C3" plotted on the abscissas correspond to the comparative examples. Specifically, in Example E1, the reinforcing layer has the bus conductors 55 and strip conductors 57. Note that, the detailed shape of the reinforcing layer in Example E1 is close to that in FIG. 7 (second embodiment). In Comparative Example C1, a solid patterned reinforcing layer is provided on the upper surface of the cover 7. A reinforcing layer is not provided in Comparative Example C2. In Comparative Example C3, a reinforcing layer and an insulation layer (see 47 in FIG. 4. These are provided in the example and other comparative examples.) covering the reinforcing layer are not provided.

The ordinates indicate the amounts of change df (Hz) of frequency or stresses σ (Pa) generated in the piezoelectric substrates 13 when changing the ambient temperatures of the SAW devices 1. The amount of change df is the amount of change of the frequency where an amount of attenuation becomes 20 dB in a ladder type filter included in the SAW device 1. The amounts of change df are obtained by actual measurements. The stresses σ are obtained by simulation computations.

A line L1 indicates the stress σ. Lines L2 to L4 indicate the amounts of change df, and are different from each other in specific design values and/or thicknesses of the reinforcing layers.

It can be confirmed from these graphs that the amount of change df becomes smaller compared with the case where the solid patterned reinforcing layer (C1) is provided by configuring the reinforcing layer 11 (E1) by bus conductors 55 and strip conductors 57. That is, it can be confirmed that it is possible to suppress reduction of the temperature compensation effect by the support substrate 15 due to the reinforcing layer. In other words, further, according to the present configuration, even if there is the reinforcing layer 11, the temperature compensation effect by the support substrate 15 can be kept. Further, it can be confirmed from a comparison of Comparative Examples C1 to C3 and Example E1 that the degree of the effect is sufficient. Further, the trend in improvement of the amount of change df is similar to the trend of the change of the stress σ, therefore it can be confirmed that the improvement of the amount of change df is caused by the stress σ.

Note that, it was confirmed that improvement of the amount of change df could be expected in Comparative Examples C2 and C3, but the lid 19 deformed to the space 21 side and contacted the piezoelectric substrate 13 due to the stress from the external part. Note that, when actually mounting the devices on circuit boards and molding parts by a transfer molding method, crushing of the space 21 was confirmed in Comparative Examples C2 and C3 in contrast to Comparative Example C1 and Example E1 maintaining the space 21.

Note that, SAW devices 1 manufactured while changing the ratios of the areas of the reinforcing layers 11 relative to the areas surrounded by the outer peripheries of the frames 17 were mounted on circuit boards and were molded by the transfer molding method to confirm the shapes of the spaces 21. As a result, it was confirmed that the space 21 could be maintained even at the time when the bus conductors 55 were decreased as in the SAW device 201 shown in FIG. 7 and the ratio of the area of the reinforcing layer 11 was controlled to 35% relative to the area surrounded by the outer periphery of the frame 17.

Figure 12:
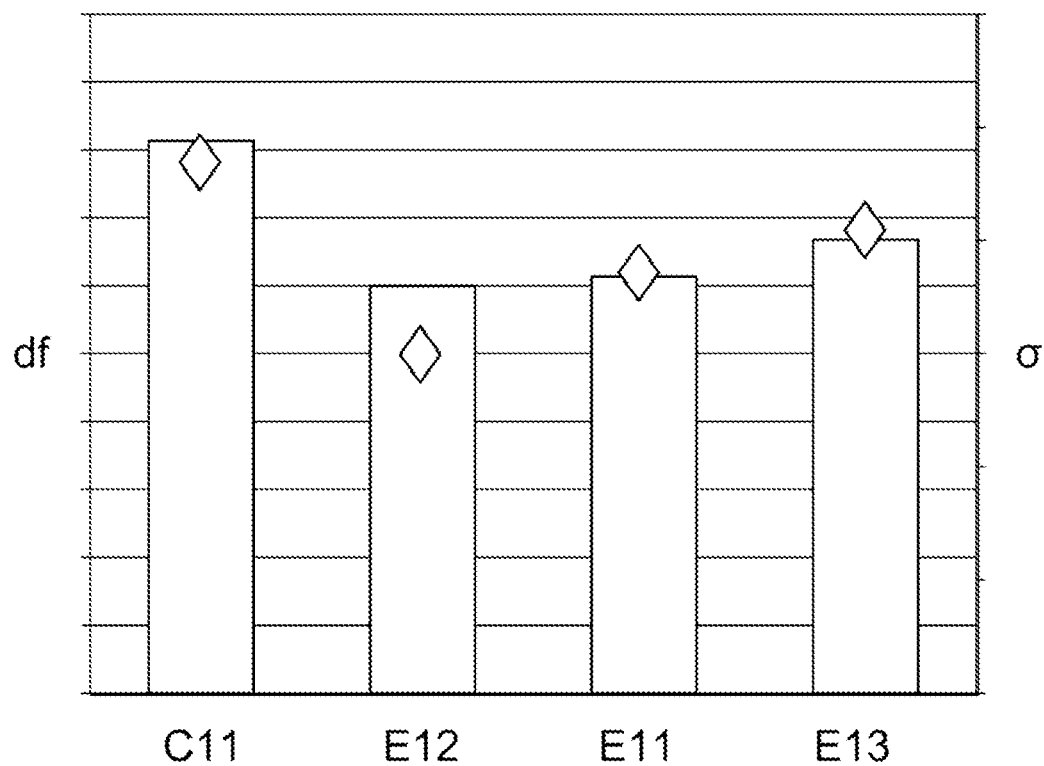
FIG. 12 is a graph showing changes of the characteristics caused by temperature changes in the SAW devices in examples and a comparative example.

FIG. 12 is a graph showing changes of the characteristics due to the temperature changes in the SAW devices in other examples and a comparative example.

"E11" to "E13" plotted on the abscissa correspond to examples, and "C1" on the abscissa corresponds to a comparative example. Specifically, in Example E11, the detailed shape of the reinforcing layer is substantially the same as the reinforcing layer 11 in the first embodiment (FIG. 5). In Example E12, the detailed shape of the reinforcing layer is substantially the same as the reinforcing layer 211 in the second embodiment (FIG. 7). In Example E13, the detailed shape of the reinforcing layer is substantially the same as the reinforcing layer 311 in the third embodiment (FIG. 8). In Comparative Example C1, a solid patterned reinforcing layer is provided on the upper surface of the cover 7.

The ordinate, in the same way as FIGS. 11A and 11B, indicates the amounts of change df of frequency or the stresses σ generated in the piezoelectric substrates 13 when changing the ambient temperatures of the SAW devices 1. In this graph as well, the amounts of change df are obtained by actual measurements, and the stresses σ are obtained by simulation computations.

The bar graphs indicate the amounts of change df by the positions of the top parts thereof. The diamond-shaped plots indicate the stresses σ.

It can be confirmed from this graph that an effect of reducing the amount of change df compared with Comparative Example C11 is obtained in all of the Examples E11 to E13 and that this effect is obtained by lowering the thermal stress. Further, it can be confirmed from a comparison of Examples E11 and E13 that the amount of change df becomes smaller in a case where the number of the strip conductors 57B extending in the direction of propagation of the SAW is made relatively smaller. Note that, from the viewpoint of reduction of the amount of change df, Example E12 is the best. However, if also considering the viewpoint of reinforcement of the cover 7, such a result is not always obtained.

The present invention is not limited to the above embodiments and may be executed in various ways.

The acoustic wave device is not limited to an SAW device. For example, the acoustic wave device may be a BAW (bulk acoustic wave) device or may be a device including a film bulk acoustic resonator. Further, the acoustic wave device is not limited to a multiplexer (duplexer in narrow sense) having a transmission filter and receiving filter. For example, it may be a multiplexer branching a plurality of reception signals as well. Further, the acoustic wave device may be one branching three or more signals or may be one having three or more filters.

The acoustic wave device may be also one having neither via conductors 45 penetrating through the cover nor terminals 9 on the cover. For example, via holes may be provided in the cover at positions on the pads 43, and the pads of the circuit board on which the acoustic wave device is mounted and the pads 43 may be directly bonded by the bumps.

The bus conductors and strip conductors may be inclined relative to the direction of propagation of the acoustic wave as well. The bus conductors and strip conductors need not extend with constant widths and may change in widths continuously or stepwise. Further, the bus conductors and strip conductors need not linearly extend, but may extend so that they are curved or bent. Bus conductors having broader widths than the strip conductors need not be provided. Further, the strip conductors may have relatively broad widths as well. For example, the strip conductors may have the same degrees of widths as that of the bus conductors in the above embodiment.

Note that, from the present disclosure, art which is not predicated on the presence of the support substrate can be extracted. For example, the following art can be derived.

An acoustic wave device including
a piezoelectric substrate,
an excitation electrode located on the piezoelectric substrate,
a cover forming a space above the excitation electrode,
a bus conductor extending on the cover, and
a first strip conductor which extends from the bus conductor with a narrower width than that of the bus conductor on the cover and at least a part of which overlaps the space when viewed on a plane.

An acoustic wave device including
a piezoelectric substrate,
an excitation electrode located on the piezoelectric substrate,
a cover forming a space above the excitation electrode,
a plurality of first strip conductors which extend on the cover and at least a part of which overlaps the space, and
one or more second strip conductors intersecting with the plurality of first strip conductors, wherein
the number of the one or more second strip conductors is less than ½ of the number of the plurality of first strip conductors.

An acoustic wave device including
a piezoelectric substrate,
an excitation electrode located on the piezoelectric substrate,
a cover forming a space above the excitation electrode, and
a plurality of first strip conductors which extend on the cover and at least a part of which overlaps the space when viewed on a plane, wherein
thicknesses are larger than widths in the plurality of first strip conductors.

Further, from the present disclosure, art predicated on neither the presence of the support substrate, nor the presence of the strip conductors can be extracted. For example, the following art can be derived.

An acoustic wave device including
a piezoelectric substrate,
an excitation electrode located on the piezoelectric substrate,
a cover covering the excitation electrode,
a first via conductor which penetrates through at least the upper surface side part of the cover and is electrically connected with the excitation electrode,
a terminal which is located on the cover and is separated from the first via conductor when viewed on a plane, and
a conductor layer which is located on the cover and connects the first via conductor and the terminal, wherein
the conductor layer includes a first extension part and a second extension part which extend in directions intersecting with each other starting from the terminal.

Note that, in the art described above, the cover may be one not forming a space above the excitation electrode as well. Accordingly, the acoustic wave device may be an acoustic boundary wave device (however, included in an SAW device in a broad sense) as well.

Further, in the examples explained above, the explanation was given by taking as an example a case where the frame 17 configuring the cover 7 was positioned on the piezoelectric substrate 13, but the present invention is not limited to this. Specifically, the piezoelectric substrate 13 may be positioned on the inner side than the support substrate 15 when viewed on a plane and the frame 17 may be positioned on the support substrate 15 which is not covered by the piezoelectric substrate 13. In the examples explained above, by suppressing the tensile stress applied to the piezoelectric substrate, the temperature compensation effect by the support substrate 15 was made to be effectively manifested. Contrary to this, when the frame 17 is positioned on the support substrate 15, the tensile stress applied to the support substrate 15 can be reduced compared with the case where the conductor patterns are solid patterns. Due to this, it becomes possible to effectively suppress the thermal expansion of the piezoelectric substrate 13.

REFERENCE SIGNS LIST

1 . . . SAW device (acoustic wave device), 7 . . . cover, 13 . . . piezoelectric substrate, 15 . . . support substrate, 23 . . . IDT electrode (excitation electrode), and 55 (55A and 553) . . . strip conductors.

The invention claimed is:
1. An acoustic wave device comprising:
a piezoelectric substrate,
a support substrate which is on a lower surface of the piezoelectric substrate and has a smaller thermal expansion coefficient than that of the piezoelectric substrate,
an excitation electrode on the piezoelectric substrate,
a cover forming a space above the excitation electrode, and
a plurality of first strip conductors which extend alongside each other on the cover and at least a part of which overlaps the space when viewed on a plane.

2. The acoustic wave device according to claim 1, further comprising a first bus conductor which extends on the cover with a broader width than each of the plurality of first strip conductors, wherein the plurality of first strip conductors extend from the first bus conductor.

3. The acoustic wave device according to claim 2, further comprising a second bus conductor which extends alongside the first bus conductor and has a broader width than those of the plurality of first strip conductors, wherein the plurality of first strip conductors bridge the first bus conductor and the second bus conductor.

4. The acoustic wave device according to claim 1, further comprising one or more second strip conductors which intersect with the plurality of first strip conductors, wherein the number of the one or more second strip conductors is less than ½ of the number of the plurality of first strip conductors.

5. The acoustic wave device according to claim 4, wherein:
the excitation electrode is an IDT electrode which comprises a plurality of electrode fingers extending alongside each other, and
the plurality of first strip conductors extend in a direction of extension of the plurality of electrode fingers.

6. The acoustic wave device according to claim 4, wherein the excitation electrode is an IDT electrode which comprises a plurality of electrode fingers extending alongside each other, and the one or more second strip conductors do not overlap the plurality of electrode fingers when viewed on a plane.

7. The acoustic wave device according to claim 1, wherein thicknesses are larger than widths in the plurality of first strip conductors.

8. The acoustic wave device according to claim 1, further comprising a connection conductor at least a part of which is located in the cover and which connects the excitation electrode and the plurality of first strip conductors.

9. The acoustic wave device according to claim 1, comprising
- a first via conductor which penetrates through at least a upper surface side part of the cover and is electrically connected with the excitation electrode,
- a terminal which is on the cover and is separated from the first via conductor when viewed on a plane, and
- a conductor layer which is on the cover and connects the first via conductor and the terminal,
- wherein the conductor layer comprises a first extension part and a second extension part which extend in directions intersecting with each other starting from the terminal.

10. The acoustic wave device according to claim 9, wherein the conductor layer further comprises a third extension part which extends alongside the first extension part and is connected with the second extension part.

11. The acoustic wave device according to claim 10, wherein the conductor layer further comprises a fourth extension part which bridges the first extension part and the third extension part.

12. The acoustic wave device according to claim 10, wherein the plurality of first strip conductors bridge the first extension part and the third extension part and are narrower in widths than the first to third extension parts.

13. The acoustic wave device according to claim 9, wherein the plurality of first strip conductors extend from the first extension part in a direction intersecting with the first extension part and are narrower in widths than the first extension part and the second extension part.

14. The acoustic wave device according to claim 9, further comprising
- a second via conductor which penetrates through only a lower surface side part of the cover and
- an internal wiring which is embedded in the cover and extends from the second via conductor parallel to an upper surface of the piezoelectric substrate,
- wherein the first via conductor penetrates through only the upper surface side part of the cover and is connected with the internal wiring.

15. A multiplexer comprising
- a transmission filter which filters a transmission signal and outputs the result to an antenna and
- a receiving filter which filters a reception signal from the antenna,
- wherein at least a part of the transmission filter and receiving filter is included in the acoustic wave device according to claim 1.

16. A communication apparatus comprising
an antenna,
a multiplexer which is connected with the antenna, and
an IC connected to the multiplexer,
wherein the multiplexer comprises
- a transmission filter which filters a transmission signal and outputs a result to the antenna,
- a receiving filter which filters a reception signal from the antenna, and
- at least a part of the transmission filter and the receiving filter is included in the acoustic wave device according to claim 1.

* * * * *